(12) United States Patent
Abedin et al.

(10) Patent No.: US 7,957,171 B2
(45) Date of Patent: Jun. 7, 2011

(54) ASSOCIATIVE MEMORY AND SEARCHING SYSTEM USING THE SAME

(75) Inventors: Md. Anwarul Abedin, Hiroshima (JP); Tetsushi Koide, Hiroshima (JP); Hans Juergen Mattausch, Hiroshima (JP); Yuki Tanaka, Hiroshima (JP)

(73) Assignee: Hiroshima University, Hiroshima (JP)

( * ) Notice: Subject to any disclaimer, the term of this patent is extended or adjusted under 35 U.S.C. 154(b) by 328 days.

(21) Appl. No.: 12/128,126

(22) Filed: May 28, 2008

(65) Prior Publication Data

US 2009/0141531 A1 Jun. 4, 2009

(30) Foreign Application Priority Data

Nov. 30, 2007 (JP) ................................ 2007-309856

(51) Int. Cl.
*G11C 15/00* (2006.01)
(52) U.S. Cl. ................ 365/49.1; 365/49.11; 365/49.12; 365/49; 365/13; 365/49.15; 365/49.16; 365/49.17; 365/49.18
(58) Field of Classification Search .............. 365/49.1, 365/49.11, 49.12, 49.13, 49.15, 49.16, 49.17, 365/49.18
See application file for complete search history.

(56) References Cited

U.S. PATENT DOCUMENTS

| | | | | |
|---|---|---|---|---|
| 6,076,141 | A * | 6/2000 | Tremblay et al. | 365/49.17 |
| 6,212,106 | B1 * | 4/2001 | Kurotsu | 365/49.17 |
| 6,415,293 | B1 * | 7/2002 | Navoni et al. | 365/49.16 |
| 6,693,815 | B2 * | 2/2004 | Mattausch et al. | 365/49.17 |
| 6,714,466 | B2 * | 3/2004 | Park et al. | 365/49.17 |
| 6,721,193 | B2 * | 4/2004 | Barnes | 365/49.17 |
| 6,775,167 | B1 * | 8/2004 | Avramescu et al. | 365/49.11 |
| 6,856,528 | B1 * | 2/2005 | Kim | 365/49.1 |
| 6,876,560 | B2 * | 4/2005 | Sugahara et al. | 365/49.1 |
| 6,976,126 | B2 * | 12/2005 | Clegg et al. | 365/49.1 |
| 7,113,416 | B2 * | 9/2006 | Koide et al. | 365/49.1 |
| 7,203,382 | B2 * | 4/2007 | Mattausch et al. | 365/49.1 |
| 7,746,678 | B2 * | 6/2010 | Mattausch et al. | 365/49.1 |

FOREIGN PATENT DOCUMENTS

| | | |
|---|---|---|
| JP | 2000-298995 | 10/2000 |
| JP | 2002-288985 | 10/2002 |
| JP | 2004-005825 | 1/2004 |
| JP | 2005-209317 | 8/2005 |

OTHER PUBLICATIONS

D.R. Tveter, "The Pattern Recognition Basis of Artificial Intelligence," IEEE computer society, 1998, pp. 84-92.
H.J. Mattausch, T. Gyohten, Y. Soda and T. Koide, "Compact Associative-Memory Architecture with Fully-Parallel Search Capability for the Minimum Hamming Distance", IEEE Journal of Solid-State circuits, vol. 37, No. 2, Feb. 2002, pp. 218-227.
H.J. Mattausch, N. Omori, S. Fukae, T. Koide and T. Gyohten, "Fully-Parallel Pattern-Matching Engine with Dynamic Adaptability to Hamming or Manhattan Distance", 2002 Symposium on VLSI Circuit Digest of Technical Papers, 2002, pp. 252-255.

* cited by examiner

*Primary Examiner* — Trong Phan
(74) *Attorney, Agent, or Firm* — Foley & Lardner LLP

(57) ABSTRACT

Associative memories capable of outputting multiple reference data close to search data are provided. A memory array compares each of the multiple reference data with the search data in parallel and generates multiple comparison current signals representing the result of the comparison. A WLA converts the multiple comparison current signals into voltages. During the first cycle, the WLA detects the lowest voltage among the voltages as Winner and detects the remaining voltages as Loser. After the second cycle, based on feedback signals, the WLA detects all the voltages other than a voltage detected as Winner during the last preceding cycle, and detects the lowest voltage among the detected voltages as Winner and detects the remaining detected voltages as Loser. The WLA repeats these operations k times.

4 Claims, 17 Drawing Sheets

FIGURE 14

LC1 ( ABCDEFGHIJKLMNOP
       QRSTUVWXYZ

LC2 ( A BCDEFGHIJKLM N O P
       QRSTU VWXY Z

LC3 ( abcdef g hi jk l m n o p
       qr s t u v wx yz

| Genre of K of reference data | Feature vector |
|---|---|
| Character | Gothic letter |
| Image | Oil painting |
| ⋮ | ⋮ |

CHT

ASSOCIATIVE MEMORY AND SEARCHING SYSTEM USING THE SAME

TECHNICAL FIELD

The described technology relates to an associative memory capable of outputting a plurality of search results and a searching system using the same.

BACKGROUND

Recently, an associative memory with the minimum distance search function has drawn attention in the field of data processing and, particularly, in image compression and image recognition. An associative memory can match patterns for object recognition required in intelligent information processing or compressing data by use of data groups called codebooks.

An associative memory is one of representative functional memories having a function of searching for data most similar closest distance) to a series of input data search data) from a plurality of reference data stored in the associative memory. Due to its excellent search function, the associative memory has been expected to dramatically improve the performance of applications that have a pattern matching function, such as image compression and image recognition, as described above.

Typically, pattern matching locates data most similar to input data from R number of reference data having a W-bit width. Thus, an associative memory having a function of minimum distance search is involved in the core part of data processing, such as image compression and image recognition. In the past, for associative memories capable of fully-parallel minimum distance search, those having a function of Hamming, Manhattan or Euclid distance search have been suggested.

Until now, architectures with fully-parallel search capability for the minimum Hamming distance or for the minimum Manhattan distance have been suggested.

However, there is a problem with conventional associative memories since only one reference data closest to search data is output as a result of comparison between search and reference data, and thus, a plurality of reference data close to the search data cannot be outputted.

It is an object of the present disclosure to resolve the above problem by providing an associative memory capable of outputting multiple reference data close to the search data.

Another object of the present disclosure is to provide a search system comprising an associative memory capable of outputting multiple reference data close to the search data.

SUMMARY

Associative memories comprising a memory array and an output circuit are provided. In one embodiment, a memory array compares each of stored multiple reference data with input search data in parallel and generates multiple comparison current signals representing the result of the comparison. Also, its output circuit excludes j−1 number of reference data searched during the search performed j−1 times from the multiple reference data at the j-th search of reference data close to the search data j is an integer satisfying 1<j≦k wherein k is an integer equal to or greater than 2 and converts the multiple comparison current signals to detect the reference data closest to the search data from the remaining reference data into voltages, while amplifying the voltages to execute k times a signal generation operation for generating a j-th output signal.

In another embodiment, an output circuit comprises a first amplifier, a second amplifier and a feedback circuit. During the j-th signal generation operation, the first amplifier converts multiple comparison current signals generated by a memory array to multiple voltages, detects voltages other than a voltage representing the reference data j−1-th closest to the search data from the multiple voltages based on a j−1-th feedback signal, and amplifies the detected voltages into a first voltage representing the reference data j-th closest to the search data and second voltages representing the reference data remote from the search data. During the j-th signal generation operation, the second amplifier further amplifies the first and second voltages outputted from the first amplifier to generate j-th output signals. During the j-th signal generation operation, the feedback circuit generates a j−1-th feedback signal based on j−1-th output signals outputted from the second amplifier and outputs the j−1-th feedback signal to the first amplifier.

In another embodiment, based on the j−1-th feedback signal, the first amplifier invalidates the comparison current signal representing the reference data j−1-th closest to the search data to detect voltages other than a voltage representing the reference data j−1-th closest to the search data from the multiple voltages.

In yet another embodiment, the first amplifier detects voltages other than a voltage representing the reference data j−1-th closest to the search data from the multiple voltages, sets a threshold value for dividing the detected voltages into first and second voltages, and compares the respective detected voltages with the threshold value to amplify them into the first and second voltages.

Further, searching systems comprising first and second associative memories are provided. In one embodiment, a first associative memory compares each of stored multiple reference data with input search data in parallel, and outputs k number of reference data in the order in which the reference data outputted earlier is closer to the search data k is an integer equal to or greater than 2. The second associative memory compares each of the k reference data outputted by the first associative memory with the search data in parallel, and outputs the reference data matching the search data.

In another embodiment, the searching system further comprises a buffer. The buffer retains output signals from the first associative memory. The first associative memory comprises a memory array and an output circuit. The memory array compares each of stored multiple reference data with input search data in parallel and generates multiple comparison current signals representing the result of the comparison. The output circuit excludes j−1 number of reference data searched during the search performed j−1 times from the multiple reference data at the j-th search of reference data close to the search data j is an integer satisfying 1≦j≦k wherein k is an integer equal to or greater than 2. To detect reference data closest to the search data from the remaining reference data, the output circuit converts the multiple comparison current signals into voltages and amplifies the voltages to execute k times a signal generation operation for generating a j-th output signal. Also, the buffer retains a j-th output signal outputted from the output circuit, while outputting k number of output signals composed of k number of reference data to the second associative memory when a k-th output signal is received from the output circuit.

In another embodiment, the first associative memory executes a search with a first distance index to output the k reference data. The second associative memory executes a search with a second distance index, which is different from the first distance index, to output the reference data matching the search data.

In another embodiment, the second associative memory adds further information to output the reference data matching the search data.

In yet another embodiment, the searching system further comprises a table maintenance section. The table maintenance section has a feature vector table showing how the genres of k number of reference data correspond to the respective feature vectors. Further, upon receiving k number of data from the first associative memory, the table maintenance section detects feature vectors corresponding to the genres of the detected k number of data with reference to the feature vector table and outputs the detected feature vectors to the second associative memory as further information.

The associative memory in accordance with the present disclosure compares each of multiple reference data with search data in parallel and generates multiple comparison current signals representing the result of the comparison. Also, the associative memory excludes j−1 number of reference data searched during the search performed j−1 times from the multiple reference data at the j-th search of reference data close to the search data j is an integer satisfying $1 \leq j \leq k$ wherein k is an integer equal to or greater than 2. To detect reference data closest to the search data from the remaining reference data, the associative memory converts the multiple comparison current signals into voltages and amplifies the voltages to execute k times a signal generation operation for generating a j-th output signal.

Therefore, multiple reference data can be output according to the present disclosure.

Also, in the searching system in accordance with the present disclosure, the first associative memory outputs k number of reference data in the order the data output earlier among all the reference data is closer to the search data, and the second associative memory searches the reference data closest to the search data among the k reference data searched by the first associative memory. In other words, the searching system according to the present disclosure gradually narrows the search range by use of multiple associative memories to search the reference data closest to the search data.

Therefore, according to the present disclosure, it is possible to correctly search the reference data closest to the search data.

The Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings in which:

FIG. 14 is a view of strings of characters having different font types.

FIG. 16 is a concept view of a feature vector table.

DETAILED DESCRIPTION

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure. The presently described embodiments will be best understood by reference to the drawings, wherein like parts are designated by like numerals throughout.

Figure 1:
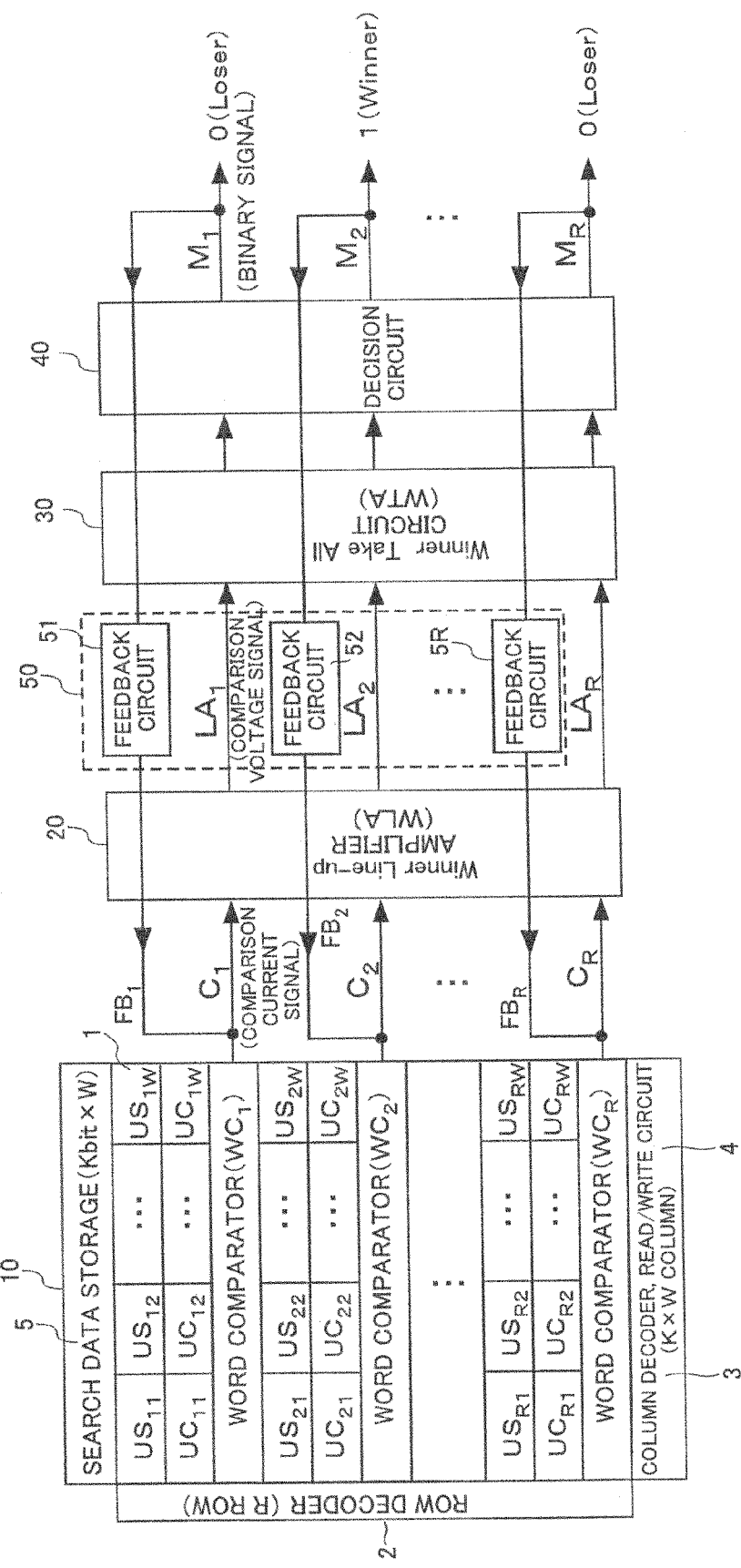
FIG. 1 is a schematic diagram of an associative memory in one embodiment of the present disclosure.

FIG. 1 is a schematic diagram of an associative memory in an embodiment of the present disclosure. Referring to FIG. 1, an associative memory 100 in the embodiment comprises a memory array 10, a winner line-up amplifier (WLA) 20, a winner take-all (WTA) circuit 30, a decision circuit 40, and a feedback circuit 50.

The memory array 10 comprises a memory 1, a row decoder 2, a column decoder 3, a Read/Write circuit (K×W column) 4, and a search data storage (Kbit×W) 5.

The memory 1 comprises unit storages $US_{11}$~$US_{1W}$, $US_{21}$~$US_{2W}$, . . . , $US_{R1}$~$US_{RW}$, unit comparators $UC_{11}$~$UC_{1W}$, $UC_{21}$~$UC_{2W}$ . . . $UC_{R1}$~$UC_{RW}$, and word comparators $WC_1$~$WC_R$. R is an integer equal to or greater than 2.

The unit comparators $UC_{11}$~$UC_{1W}$ are configured to correspond to the unit storages $US_{11}$~$US_{1W}$ respectively. The unit comparators $UC_{21}$~$UC_{2W}$ are configured to correspond to the unit storages $US_{21}$~$US_{2W}$, respectively. Similarly, the unit comparators $UC_{R1}$~$UC_{RW}$ are configured to correspond to the unit storages $US_{R1}$~$US_{RW}$, respectively.

A word comparator $WC_1$ is provided in a way to correspond to the unit storages $US_{11}$~$US_{1W}$ and the unit comparators $UC_{11}$~$UC_{1W}$, and a word comparator $WC_2$ is provided in a way to correspond to the unit storages $US_{21}$~$US_{2W}$ and the unit comparators $UC_{21}$~$UC_{2W}$. Similarly, a word comparator $WC_R$ is provided in a way to correspond to the unit storages $US_{R1}$~$US_{RW}$ and the unit comparators $UC_{R1}$~$UC_{RW}$.

The unit storages $US_{11}$~$US_{1W}$, $US_{21}$~$US_{2W}$, ..., $US_{R1}$~$US_{RW}$ store reference data written by the row decoder 2, the column decoder 3 and the Read/Write circuit 4.

The unit comparators $UC_{11}$~$UC_{1W}$ compare the reference data stored in the unit storages $US_{11}$~$US_{1W}$ with the search data stored in the search data storage 5. Further, the unit comparators $UC_{21}$~$UC_{2W}$ compare the reference data stored in the unit storages $US_{21}$~$US_{2W}$ with the search data stored in the search data storage 5. Similarly, the unit comparators $UC_{R1}$~$UC_{RW}$ compare the reference data stored in the unit storages $US_{R1}$~$US_{RW}$ with the search data stored in the search data storage 5. Further, the comparison between reference data and search data in the unit comparators $UC_{11}$~$UC_{1W}$, $UC_{21}$~$UC_{2W}$, ..., and $UC_{R1}$~$UC_{RW}$ is performed in parallel.

Further, the comparison between the reference data and search data in the unit comparators $UC_{11}$~$UC_{1W}$, $UC_{21}$~$UC_{2W}$, ... and $UC_{R1}$~$UC_{RW}$ is performed by use of any distance index among Hamming, Manhattan, Euclid distance and a combination thereof.

In other words, when the Hamming distance or the Manhattan distance is used as a distance index, the unit comparators $UC_{11}$~$UC_{1W}$, $UC_{21}$~$UC_{2W}$, ..., and $UC_{R1}$~$UC_{RW}$ use the following mathematical equation to compare search data and reference data.

$$D_{Hamm,Manh} = \Sigma |D_1 - S_1| \qquad \text{[Equation 1]}$$

In Equation 1, $D_i$ is reference data, and $S_i$ is search data. When $D_i$ and $S_i$ are respectively 1-bit data, Equation 1 represents a Hamming distance. When Di and Si are respectively multi-bits data, Equation 1 represents a Manhattan distance.

When the Euclid distance is used as a distance index, the unit comparators $UC_{11}$~$UC_{1W}$, $UC_{21}$~$UC_{2W}$, ..., and $UC_{R1}$~$UC_{RW}$ use the following mathematical equation to compare search data and reference data.

$$D_{Eucl} = \sqrt{\Sigma |D_1 - S_1|^2} \qquad \text{[Equation 2]}$$

The word comparator $WC_1$ generates a comparison current signal $C_1$ representing the result of the comparison between the reference data and the search data by the unit comparators $UC_{11}$~$UC_{1W}$, and outputs the comparison current signal $C_1$ to the WLA 20. The word comparator $WC_2$ generates a comparison current signal $C_2$ representing the result of the comparison between the reference data and the search data by the unit comparators $UC_{21}$~$UC_{2W}$, and outputs the comparison current signal $C_2$ to the WLA 20. Similarly, the word comparator $WC_R$ generates a comparison current signal $C_R$ representing the result of the comparison between the reference data and the search data by the unit comparators $UC_{R1}$~$UC_{RW}$, and outputs the comparison current signal $C_R$ to the WLA 20.

Therefore, the memory 1 compares each of the multiple reference data with the search data in parallel, and generates the comparison current signals $C_1$~$C_R$ representing the result of the comparison to output the generated current signals $C_1$~$C_R$ to the WLA 20.

The row decoder 2 designates a row address of the memory 1, and the column decoder 3 designates a column address of the memory 1. The Read/Write circuit 4 writes the reference data in the unit storages $US_{11}$~$U_{1W}$, $US_{21}$~$US_{2W}$, ..., $US_{R1}$~$US_{RW}$ designated by the row decoder 2 and the column decoder 3 and at the same time writes the search data in the search data storage 5.

The search data storage 5 stores the search data written by the Read/Write circuit 4.

The WLA 20 receives multiple comparison current signals $C_1$~$C_R$ from the memory array 10, and receives multiple feedback signals $FB_1$~$FB_R$ from the feedback circuit 50. The respective feedback signals $FB_1$~$FB_R$ comprises a voltage VDD or a voltage Vref.

The WLA 20 converts the multiple comparison current signals $C_1$~$C_R$ to multiple voltages $V_{C1}$~$V_{CR}$. During the first cycle, the WLA 20 receives feedback signals $FB_1$~$FB_R$, each of which comprises a voltage VDD, from the feedback circuit 50, amplifies the lowest voltage $V_{Ci}$ among the multiple voltages $V_{C1}$~$V_{CR}$ i is an integer satisfying ($1 \leq i \leq R$) into Winner $V_W$, and amplifies the remaining voltages ($V_{C1}$~$V_{CR} \neq V_{Ci}$) into Loser ($V_L < V_W$).

Thereafter, during the second cycle, the WLA 20 receives feedback signals $FB_1$~$FB_R$, which include $FB_1$~$FB_{i-1}$ and $FB_{i+1}$~$FB_R$=VDD, and $FB_i$=Vref e.g., Vref=Gnd, from the feedback circuit 50, amplifies the lowest voltage (e.g., $V_{C2}$) among R−1 number of voltages ($V_{C1}$~$V_{Ci-1} \neq V_{Ci}$) and $V_{Ci+1}$~$V_{CR}$, into Winner $V_W$, and amplifies the remaining voltages $V_{C1}$, $V_{C3}$~$V_{Ci-1}$, and $V_{Ci+1}$~$V_{CR}$ into Loser $V_L$.

During the third cycle, the WLA 20 receives feedback signals $FB_1$~$FB_R$, which include $FB_1$, $FB_3$~$FB_{i-1}$ and $FB_{i+1}$~$FB_R$=VDD, and $FB_2$ and FBi=Vref, from the feedback circuit 50, amplifies the lowest voltage (e.g., $V_{C5}$) among R−2 number of voltages $V_{C1}$, $V_3$~$V_{Ci-1}$ and $V_{Ci+1}$~$V_{CR}$ into Winner $V_W$, and amplifies voltages $V_{C1}$, $V_{C3}$, $V_{C4}$, $V_{C6}$~$V_{Ci-1}$ and $V_{Ci+1}$~$V_{CR}$ into Loser $V_L$.

The WLA 20 repeats the above-described operations during a predetermined number of cycles. During these cycles, the voltage $V_{Ci}$ is the lowest voltage among the R voltages $V_{C1}$~$V_{CR}$, the voltage $V_{C2}$ is the second lowest voltage among the R voltages $V_{C1}$~$V_{CR}$, and the voltage $V_{C5}$ is the third lowest voltage among the R voltages $V_{C1}$~$V_{CR}$.

Therefore, the WLA 20 selects the lowest voltage among R of voltages $V_{C1}$~$V_{CR}$, amplifies the selected voltage into Winner $V_W$, and amplifies the remaining voltages as Loser $V_L$.

In other words, during the j-th cycle j is an integer satisfying $1 \leq j \leq k$, and k is an integer equal to or greater than 2, the WLA 20 removes j−1 number of voltages beginning from the lowest voltage $V_{CMIN}$ to the j−1-th lowest voltage $V_{Cj-1}$ from the R voltages $V_{C1}$~$V_{CR}$, amplifies the lowest voltage among (R−j−1) number of voltages $V_{C1}$~$V_{CR-j-1}$ as Winner $V_W$, and amplifies the remaining voltages as Loser $V_L$. Further, the WLA 20 repeats the above-described operations until the k-th lowest voltage $V_{Ck}$ among the R voltages $V_{C1}$~$V_{CR}$ is amplified into Winner $V_W$.

Additionally, the WLA 20 outputs the voltages amplified in the respective cycles to a WTA circuit 30. For example, the WLA 20 outputs comparison voltage signals $LA_1$~$LA_R$ to the WTA 30.

The WTA circuit 30 further amplifies the voltages received from the WLA 20 during the respective cycles and outputs the further amplified voltages to the decision circuit 40.

The decision circuit 40 converts the voltages received from the WTA 30 circuit into binary values based on a threshold value to output $M_1$~$M_R$ as output signals In such case, an output signal $M_i$ among signals ($M_1$~$M_R$ e.g., $M_2$) comprises "1," which indicates that the reference data closest to the search data has been searched (i.e., Winner), and the remaining signals ($M_1$~$M_R \neq M_i$) comprise "0," which indicates that the reference data is remote from the search data (i.e., Loser). "1" indicative of Winner has a voltage VDD, and "0" indicative of Loser has a voltage (Vref Gnd)<(VDD).

The feedback circuit 50 receives output signals $M_1 \sim M_R$, generates feedback signals $FB_1 \sim FB_R$ comprising voltage levels inverted from the voltage levels forming signals $M_1 \sim M_R$, and outputs the generated feedback signals $FB_1 \sim FB_R$ to the WLA circuit 20.

Specifically, the feedback circuit 50 comprises multiple feedback circuits (51~5R). The feedback circuits (51~5R) receive signals $M_1 \sim M_R$, respectively, generate feedback signals $FB_1 \sim FB_R$ comprising voltage levels inverted from the voltage levels forming signals $M_1 \sim M_R$, and output the generated feedback signals $FB_1 \sim FB_R$ to the WLA circuit 20.

In such case, if the feedback signal FB comprising Vref has been generated and outputted to the WLA 20, then the respective feedback circuits (51~5R) maintain the feedback signal FB comprising Vref.

Figure 2:
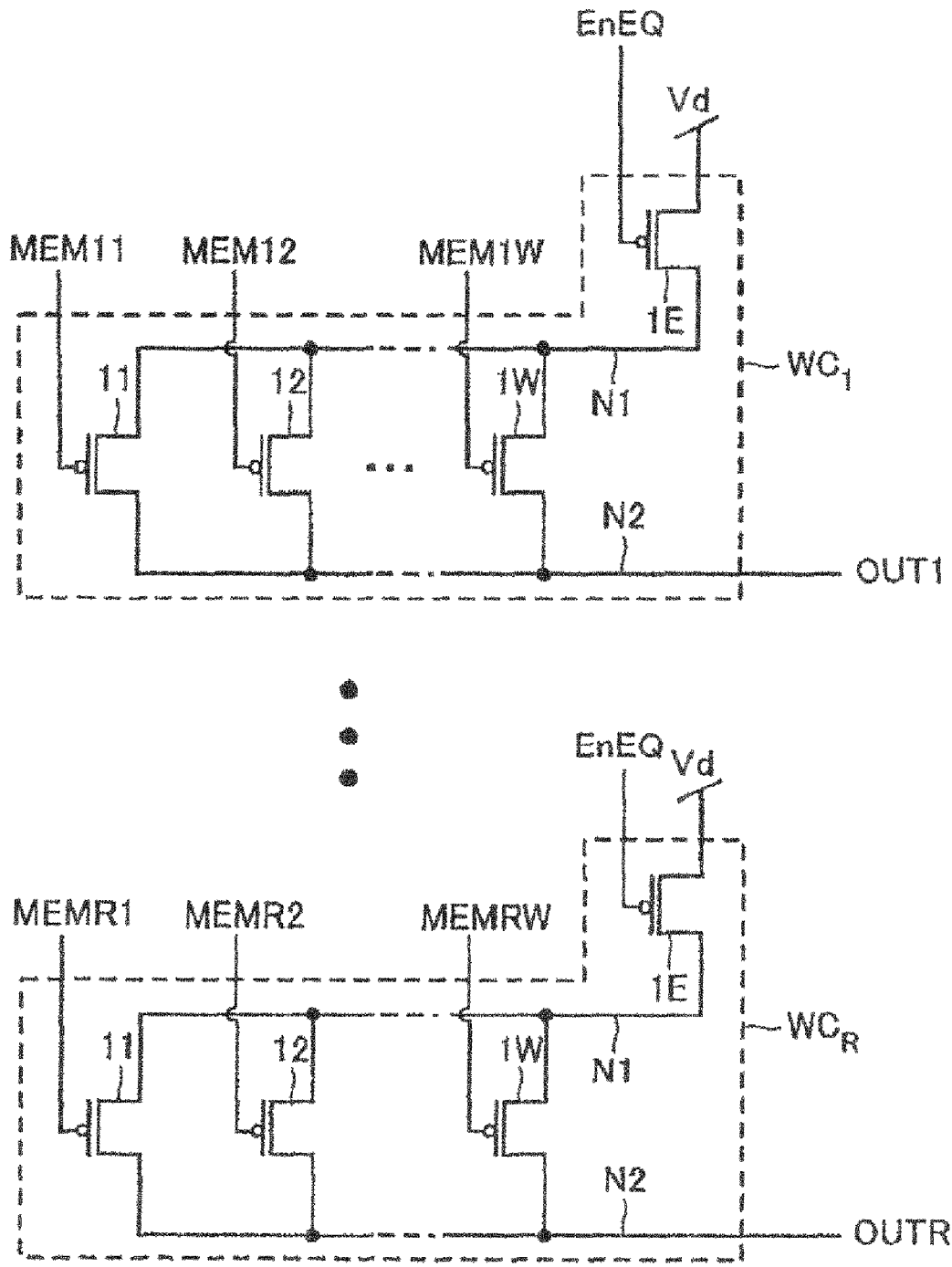
FIG. 2 is a circuit diagram of word comparators shown in FIG. 1.

FIG. 2 is a circuit diagram of word comparators $WC_1 \sim WC_R$ shown in FIG. 1. Referring to FIG. 2, the word comparator $WC_1$ comprises p-type MOS (Metal Oxide Semiconductor) transistors (11~1W, 1E).

The p-type MOS transistors (11~1W) are connected in parallel between nodes N1 and N2. In such case, the source and drain of the respective p-type transistors (11~1W) are connected to the node N1 and the node N2, respectively.

Further, at their respective gates, the p-type MOS transistors (11~1W) receive voltages MEM11~MEM1W representative of the results of the comparison made in the unit comparators $UC_{11} \sim UC_{1W}$.

The p-type MOS transistor 1E is connected between node N1 and power node Vd, to which a voltage VDD is supplied. The p-type MOS transistor 1E receives at its gate an enable signal EnEQ. The enable signal EnEQ is to enable the word comparator $WC_1$, and comprises a voltage (Vref Gnd) or a voltage VDD.

When an enable signal EnEQ comprising a voltage Vref is received at its gate, the p-type MOS transistor 1E is turned on and supplies the voltage VDD from a power node Vd to the node N1 to enable the word comparator $WC_1$. Further, when an enable signal EnEQ comprising a voltage VDD is received at its gate, the p-type MOS transistor 1E is turned off to stop the word comparator $WC_1$.

The respective voltages MEM11~MEM1W comprise a voltage VDD when the corresponding bits between the reference data and the search data match one another, while comprising a voltage Vref when said corresponding bits do not match.

Therefore, when voltages MEM11~MEM1W each comprising a voltage VDD are received at their respective gates, the p-type MOS transistors (11~1W) are turned off to prevent any current from flowing to the node N2 from the node N1. On the other hand, when voltages MEM11~MEM1W each comprising a voltage Vref are received at their respective gates, the p-type MOS transistors (11~1W) allow a constant amount of current corresponding to transistor size to flow from the node N1 to the node N2.

As a result, in the word comparator $WC_1$, when the distance between the search data and the reference data stored in the unit storages $US_{11} \sim US_{1W}$ is shortest (i.e., when the search data and the reference data match each other), voltages MEM11~MEM1W each comprising VDD are received at the respective gates of the p-type MOS transistor (11~1W). Therefore, no current flows from the node N1 to the node N2, and the voltage forming an output signal OUT1 becomes lowest.

Further, in the word comparator $WC_1$, when the distance between the search data and the reference data stored in the unit storages $US_{11} \sim US_{1W}$ becomes farther, the number of voltages MEM11~MEM1W each comprising Vref increases, a larger amount of current flows from the node N1 to the node N2, and the voltage forming the output signal OUT1 becomes higher.

Further, in the word comparator $WC_1$, when the distance between the search data and the reference data stored in the unit storages $US_{11} \sim US_{1W}$ is farthest, the voltages MEM11~MEM1W each comprising Vref are received at the respective gates of the p-type MOS transistors (11~1W) (meaning 11, 12, 13 . . . 1W). Therefore, the greatest amount of current flows from the node N1 to the node N2, and the voltage forming the output signal OUT1 becomes highest.

As described above, the word comparator $WC_1$ outputs a signal OUT1 comprising a relatively low voltage when the distance between the search data and the reference data stored in the unit storages $US_{11} \sim US_{1W}$ is relatively short, and outputs a signal OUT1 comprising a relatively high voltage when the distance between the search data and the reference data stored in the unit storages $US_{11} \sim US_{1W}$ is relatively far.

The respective word comparators $WC_2 \sim WC_R$ have the same constitution as the word comparator $WC_1$ and output OUT2~OUTR as output signals, respectively, by the same mechanism as the word comparator $WC_1$.

Figure 3:
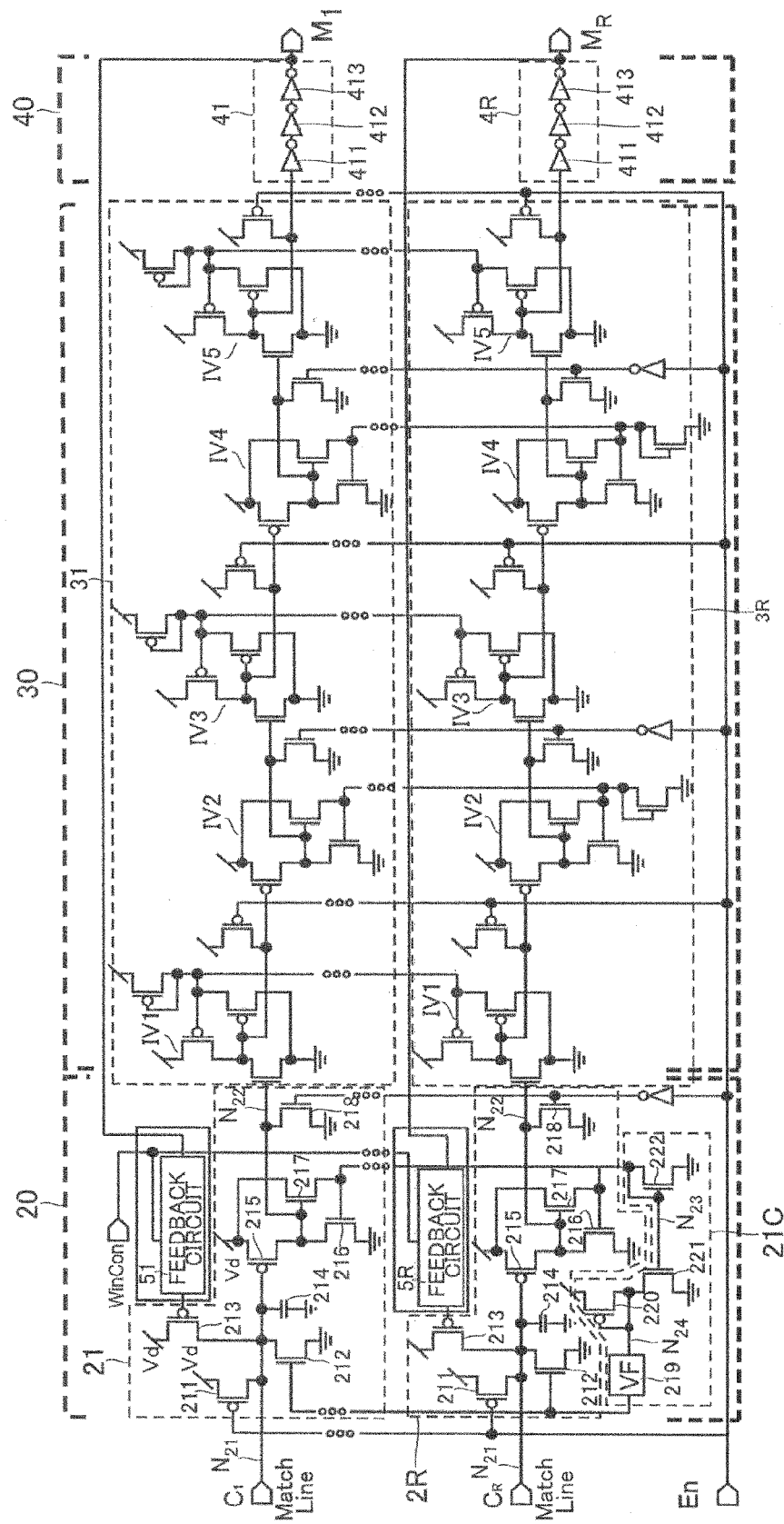
FIG. 3 is a circuit diagram of a winner line-up amplifier (WLA), a winner take all (WTA) and a decision circuit shown in FIG. 1.

FIG. 3 is a circuit diagram of the WLA 20, the WTA 30 and the decision circuit 40 of FIG. 1. Referring to FIG. 3, the WLA 20 comprises WLAs (21~2R) and a control circuit 21C. The WLA 21 comprises p-type MOS transistors 211, 213, 215, n-type MOS transistors 212, 216~218, and a capacitor 214.

The p-type MOS transistor 211 is connected between a power node Vd, to which a voltage VDD is supplied, and a node $N_{21}$, to which a comparison current signal $C_1$ is supplied. In such case, the source of the p-type MOS transistor 211 is connected to the power node Vd and its drain is connected to the node $N_{21}$.

Further, when an enable signal En comprising (Vref Gnd) is received at its gate, the p-type MOS transistor 211 supplies current from the power node Vd to the node $N_{21}$ until the node $N_{21}$ has a potential of VDD and disables the WLA 21. Also, when an enable signal En comprising VDD is received at its gate, the p-type MOS transistor 211 does not supply current from the power node Vd to the node $N_{21}$ and enables the WLA 21

The n-type MOS transistor 212 is connected between the node $N_{21}$ and a ground node. In such case, the drain of the n-type MOS transistor is connected to the node $N_{21}$ and its source is connected to the ground node. Also, the n-type MOS transistor 212 receives a control voltage VC at its gate from a VF (Voltage Follower) circuit 219 of the control circuit 21C. Then, the n-type MOS transistor 212 converts the comparison current signal supplied to the node $N_{21}$ into a voltage according to the level of the control voltage VC, and supplies the converted voltage to the gate of the p-type MOS transistor 215.

The p-type MOS transistor 213 is connected between a power node Vd and the node $N_{21}$. In such case, the source of the p-type MOS transistor 213 is connected to the power node Vd and its drain is connected to the node $N_{21}$. Further, the gate of the p-type MOS transistor 213 is connected to the output of the feedback circuit 51.

When a feedback signal $FB_1$ comprising Vref Gnd is received at its gate from the feedback circuit 51, the p-type transistor 213 supplies current from the power node Vd to the node $N_{21}$ until the node $N_{21}$ has a potential of VDD. Further, when the feedback signal $FB_1$ comprising VDD is received at its gate from the feedback circuit 51, the p-type MOS transistor 213 does not supply current from the power node Vd to the node $N_{21}$ at all.

The capacitor 214 is connected between the node $N_{21}$ and a ground node. Further, the capacitor 214 smoothes the voltage on the node $N_{21}$, which has been converted by the n-type MOS transistor 212, and the smoothened voltage is outputted to the gate of the p-type MOS transistor 215.

The p-type MOS transistor 215 and the n-type MOS transistor 216 are connected in series between a power node Vd and a ground node. In such case, the source of the p-type MOS transistor 215 is connected to the power node Vd, and its drain is connected to the drain of the n-type MOS transistor 216. The source of the n-type MOS transistor 216 is connected to the ground node.

The drain of the n-type MOS transistor 217 is connected to the power node Vd, and its source is connected to the gate of the n-type MOS transistor 216. Further, its gate is connected to the drain of the p-type MOS transistor 215, the drain of the n-type MOS transistor 216 and a node $N_{22}$.

The drain and the source of the n-type MOS transistor 218 are connected to the node $N_{22}$ and a ground node, respectively, and an inverted signal of the enable signal En is received at its gate.

The respective WLAs (22~2R) have the same constitution as the WLA 21.

The control circuit 21C comprises a VF circuit 219, p-type MOS transistor 220, and n-type MOS transistors 221, 222. The VF circuit 219 is connected between the gate of R number of n-type MOS transistors 212 in the WLAs (21~21R), and the drain and gate of the p-type MOS transistor 220.

The p-type MOS transistor 220 and the n-type MOS transistor 221 are connected in serial between a power node Vd and a ground node. Further, the p-type MOS transistor 220 is diode-connected between the power node Vd and the drain of the n-type MOS transistor 221. Also, the gate of the n-type MOS transistor 221 is connected to the drain and gate of the n-type MOS transistor 222.

The n-type MOS transistor 222 is diode-connected between the source of the n-type MOS transistor 217 in R number of WLAs (21~21R) and a ground node.

The n-type MOS transistor 222 allows the sum of current represented as $i_1$~$i_R$ flowing in R number of n-type MOS transistors 217 included in the WLAs (21~2R) to flow to a node $N_{23}$. Further, the n-type MOS transistor 221 receives a voltage in proportion to the current supplied to the node $N_{23}$ at its gate to relatively lower the voltage on a node $N_{24}$ when the level of the received voltage is relatively high and to relatively increase the voltage on the node $N_{24}$ when the level of the received voltage is relatively low. The VF circuit 219 generates a control voltage VC in proportion to the voltage on the node $N_{24}$, and outputs the generated control voltage VC to the gates of the R number of n-type MOS transistors 212.

Figure 4:
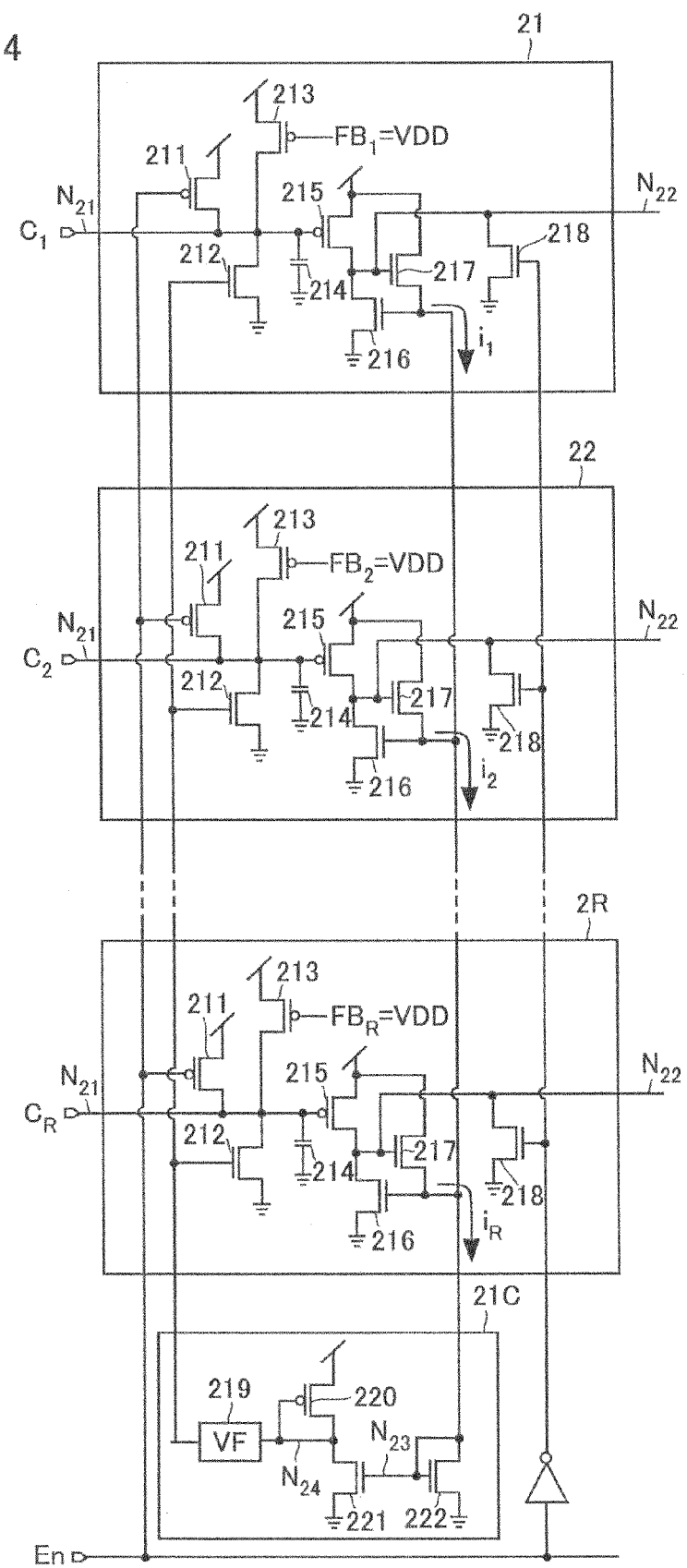
FIG. 4 illustrates exemplary operations of the WLA.
Figure 5:
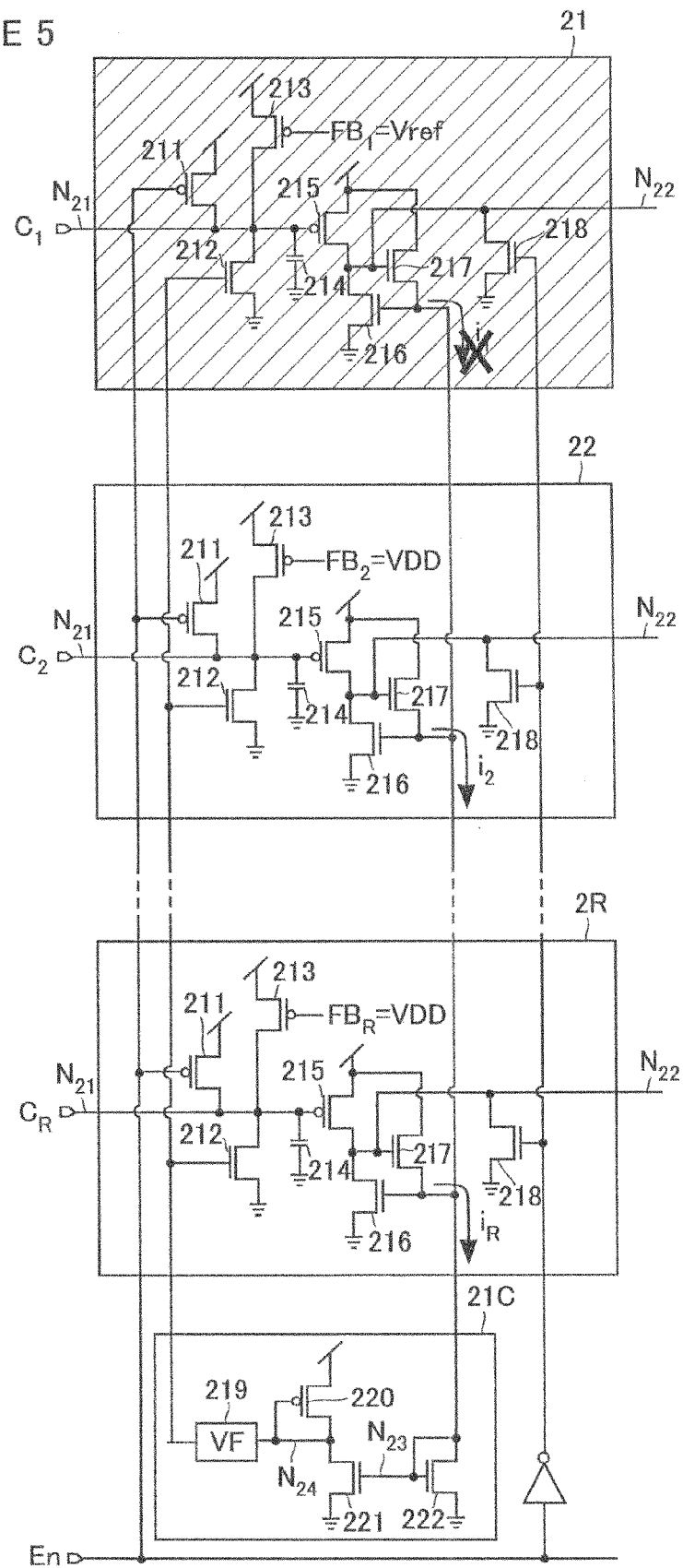
FIG. 5 illustrates exemplary operations of the WLA.
Figure 6:
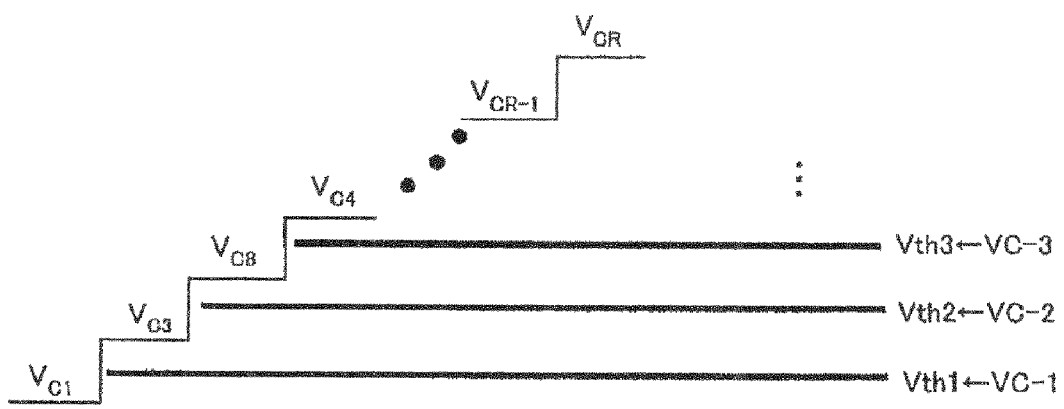
FIG. 6 illustrates exemplary operations of the WLA.

FIGS. 4-6 illustrate the operations in the WLA 20. Referring to FIG. 4, R number of p-type transistors 213 included in the WLAs (21~2R) receive feedback signals $FB_1$~$FB_R$, respectively, each comprising a voltage VDD, from the feedback circuits (51~5R) during the first cycle in the clock. Therefore, R number of p-type MOS transistors 215 included in the WLAs (21~2R) receive voltages $V_{C1}$~$V_{CR}$ at their respective gates, wherein the voltages $V_{C1}$~$V_{CR}$ are in proportion to comparison current signals $C_1$~$C_R$, respectively.

The respective comparison current signals $C_1$~$C_R$ comprise a relatively small amount of current when the distance between the reference data and the search data is relatively short, and comprises a relatively large amount of current when the distance therebetween is relatively lengthy. Therefore, R number of voltages $V_{C1}$~$V_{CR}$ have different values from one another.

Accordingly, R number of p-type MOS transistors 215 included in the WLAs (21~2R) supply a respective current according to the level of voltages $V_{C1}$~$V_{CR}$ from the power node Vd to the node $N_{22}$. In other words, R number of p-type MOS transistors 215 included in the WLAs (21~2R) supply a relatively large current to the node $N_{22}$ when the level of respective voltages $V_{C1}$~$V_{CR}$ is relatively low and supply a relatively small current to the node $N_{22}$ when the level of respective voltages $V_{C1}$~$V_{CR}$ is relatively high.

As a result, the voltage on the node $N_{22}$ is relatively high when the level of voltages $V_{C1}$~$V_{CR}$ is relatively low, while being relatively low when the level of voltages $V_{C1}$~$V_{CR}$ is relatively high. Further, the R n-type MOS transistors 217 included in the WLAs (21~2R) supply a relatively large current to the n-type MOS transistor 222 when the voltage on the node $N_{22}$ is relatively high, while supplying a relatively small current to the n-type MOS transistor 222 when the voltage on the node $N_{22}$ is relatively low.

When the total amount of current received at the n-type MOS transistor 222 from all of the R n-type MOS transistor 217 included in the WLAs (21~21R) is represented as $i_1 + i_2 + \ldots + i_R$ and the voltage on the node $N_{23}$ is represented as $V_1$ when the n-type MOS transistor 222 receives the current represented as $i_1 + i_2 + \ldots + i_R$, the voltage on the node $N_{24}$ becomes lowest and the VF circuit 219 applies a control voltage $V_{C-1}$ comprising the lowest voltage to the gates of the R number of n-type MOS transistors 212 included in the WLA 20.

As a result, the comparison current signals $C_1$~$C_R$ are converted into voltages $V_{C1}$~$V_{CR}$ comprising a voltage level according to the control voltage $V_{C-1}$ applied to the gates of the n-type MOS transistors 212 included respectively in the WLAs (21~2R). The respective converted voltages $V_{C1}$~$V_{CR}$ are applied to the gates of p-type MOS transistors 215 included in the WLAs (21~2R).

In such case, the voltages $V_{C1}$~$V_{CR}$ converted from the comparison current signals $C_1$~$C_R$ by the n-type MOS transistor 212 can be listed in the order higher voltages are preceded by lower voltages as follows: $V_{C1}, V_{C3}, V_{C8}, V_{C4}, \ldots V_{CR-1}, V_{CR}$ See FIG. 6).

By doing so, the p-type MOS transistor 215 in the WLA 21 supplies a larger current to the node $N_{22}$ than the p-type MOS transistors 215 in the WLAs (22~2R) and the voltage on the node $N_{22}$ of the WLA 21 will become highest.

The amount of current supplied by the p-type MOS transistors 215 in the WLAs (22~22R) from the power node Vd to the node $N_{22}$ is smaller than the current supplied by the p-type MOS transistor 215 in the WLA 21 from the power node Vd to the node $N_{22}$, and the voltage on the node $N_{22}$ in the WLAs (22~2R) will be lower than that on the node $N_{22}$ in the WLA 21.

The respective WLAs (21~2R) comprise a p-type MOS transistor 215 and a n-type MOS transistor 216, which are connected in series between a power node Vd and a ground node, whereby the voltage on the node $N_{21}$ at the input side is inversely amplified by the function of an inverting amplifier to output the voltage over the node $N_{22}$ at the output side.

Further, the control voltage $V_{C-1}$ applied to the gates of the R n-type MOS transistors 212 in the WLAs (21~2R) is adapted to output the voltage on the node $N_{22}$ in the WLA 21, which outputs the highest voltage, over the node $N_{22}$ as Winner $V_W$, and to output the voltage on the node $N_{22}$ in the WLAs (22~2R) over the node $N_{22}$ as Loser ($V_L < V_W$). In other words, the control voltage $V_{C-1}$ is adapted to set a threshold voltage Vth1 (See threshold Vth1←VC−1 in FIG. 6) to the respective WLAs (21~2R) [=an inverting amplifier comprising a p-type MOS transistor 215 and a n-type MOS transistor 216] for outputting the lowest voltage $V_{C1}$ as Winner $V_W$ over the node $N_{22}$ and outputting the remaining voltages ($V_{C1} \sim V_{CR} \neq V_{C1}$) as Loser ($V_L < V_W$) over the node $N_{22}$.

Referring to FIG. 5, during the second cycle, the p-type MOS transistor 213 in the WLA 21 receives a feedback signal $FB_1$ comprising (Vref Gnd) at its gate, and R−1 number of p-type transistors 213 in the WLAs (22~2R) receive feedback signals $FB_2 \sim FB_R$ comprising VDD at their respective gates.

By doing so, the p-type MOS transistor 213 in the WLA 21 supplies a current from a power node Vd to the node $N_{21}$ until the node $N_{21}$ has a potential of VDD, and the p-type MOS transistors 213 in the WLAs (22~2R) supply no current from the power node Vd to the node $N_{21}$.

As a result, the p-type MOS transistor 215 in the WLA 21 receives at its gate a voltage VDD, which is not converted by the n-type MOS transistor 212 from the comparison current signal $C_1$ but is converted by the n-type MOS transistor 212 from the current supplied from the p-type MOS transistor 215 to the node $N_{21}$, and supplies no current from the power node Vd to the node $N_{22}$. Further, the voltage on the node $N_{22}$ in the WLA 21 decreases. Also, the n-type MOS transistor 217 in the WLA 21 does not supply current $i_1$ to the n-type MOS transistor 222.

As described above, the WLA 21, which received a feedback signal $FB_1$ comprising (Vref Gnd), invalidates the comparison current signal $C_1$ received from the memory array 10.

The p-type MOS transistors 215 in the WLAs (22~2R) supply a current from the power node Vd to the node $N_{22}$, and the respective n-type MOS transistors 217 in the WLAs (22~2R) supply currents $i_2 \sim i_R$ to the n-type MOS transistor 222.

As a result, the n-type MOS transistor 222 receives the current $i_2 + \ldots + i_R$, which is smaller than the current represented as $i_1 + i_2 + \ldots + i_R$. Therefore, the voltage on the node $N_{23}$ is a voltage $V_2$, which is lower than $V_1$.

In that event, the voltage on the node $N_{24}$ will increase, and the VF circuit 219 will output a control voltage $V_{C-2}$ to the respective gates of the R n-type MOS transistors 212 in the WLAs (21~2R), wherein $V_{C-2}$ is higher than the control voltage $V_{C-1}$.

As a result, the n-type MOS transistors 212 in the WLAs (21~2R) allow a larger current to flow from the node $N_{21}$ to the ground node. In the WLAs (22~2R), the comparison current signals $C_2 \sim C_R$ are converted by the n-type MOS transistors 212 into voltages $V_{C2} \sim V_{CF}$ whose levels are lower than those in the first cycle.

The WLA 20 converts the lowest voltage $V_{C3}$ among voltages $V_{C2} \sim V_{CR}$ into Winner $V_W$, and converts the remaining voltages ($V_{C2} \sim V_{CR} \neq V_{C3}$) into Loser $V_L$.

Therefore, the control voltage $V_{C-2}$ is adapted to set a threshold voltage Vth2 (See threshold Vth2←VC−2 in FIG. 6) to the respective WLAs (21~2R) [=an inverting amplifier comprising a p-type MOS transistor 215 and an n-type MOS transistor 216] for outputting the lowest voltage $V_{C3}$ among voltages $V_{C2} \sim V_{CR}$ as Winner $V_W$ over the node $N_{22}$ and outputting the remaining voltages ($V_{C2} \sim V_{CR} \neq V_{C3}$) as Loser ($V_L < V_W$) over the node $N_{22}$. Also, the control voltage $V_{C-3}$ is adapted to set a threshold voltage Vth3 (See threshold Vth3←VC−3 in FIG. 6)

The WLA 20 repeats the above-described operations beginning from the third cycle to the k-th cycle, selects k number of voltages among the R of initially supplied voltages $V_{C1} \sim V_{CR}$ in the order in which an earlier selected voltage is lower than the later selected one, and outputs the selected voltage as $V_W$.

As described above, after the second cycle in the WLA 20 according to the present disclosure, the threshold voltage Vth for detecting Winner $V_W$ and Loser $V_L$ in R number of WLAs (21~2R) gradually increases to divide the voltages, other than a voltage detected as Winner one of ($V_{C1} \sim V_{CR}$) in the last preceding cycle, into Winner $V_W$ and Loser $V_L$.

Referring back to FIG. 3, the WTA circuit 30 comprises WTA circuits (31~3R). The respective WTA circuits (31~3R) are configured to correspond to the WLAs (21~2R), respectively. Further, the respective WTA circuits (31~3R) comprise five inverting amplifiers IV1~IV5. The five inverting amplifiers IV1~IV5 are connected in series between the WLA 20 and the decision circuit 40.

Also, in the above, the word comparators, Winner Line-up amplifier and Winner Take All circuit may have pairs of n-type MOS transistor and p-type MOS transistor.

The inverting amplifiers IV1~IV5 in the WTA circuits (31~3R) inversely amplify output signals from the WLAs (21~2R) five times and output the inversely amplified signals to the decision circuit 40.

The decision circuit 40 comprises decision circuits (41~4R). The decision circuits (41~4R) are configured to correspond to the WTA circuits (31~3R), respectively. The respective decision circuits (41~4R) comprise three inverters (411~413) connected in series. Therefore, the decision circuits (41~4R) invert the output signals from the WTA circuits (31~3R) and output $M_1 \sim M_R$ as the inverted signals.

Figure 7:
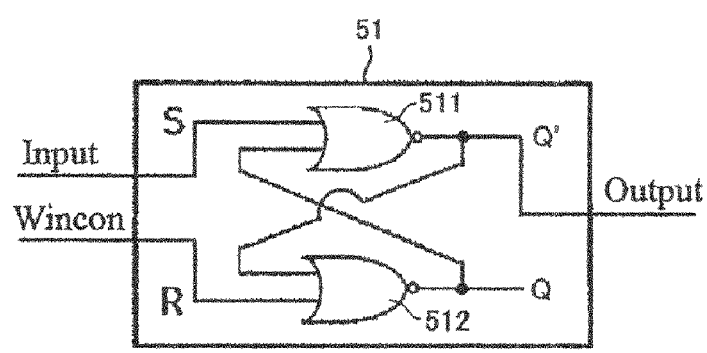
FIG. 7 is a circuit diagram of the feedback circuit of FIG. 3.

FIG. 7 is a circuit diagram of the feedback circuit 51 shown in FIG. 3. Referring to FIG. 7, the feedback circuit 51 comprises NOR gates 511, 512. The input terminal at one side of the NOR gate 511 receives an input signal S, and the input terminal at the other side of the NOR gate 511 is connected to the output terminal Q to the NOR gate 512.

Further, the input terminal at one side of the NOR gate 512 receives an input signal (Wincon) R and the input terminal at the other side of the NOR gate 512 is connected to the output terminal Q' of the NOR gate.

In other words, the feedback circuit 51 comprises an SR flip-flop or the like.

Further, the respective feedback circuits (52~5R) may have the same circuit diagram as that of the feedback circuit 51 shown in FIG. 7.

Figure 8:
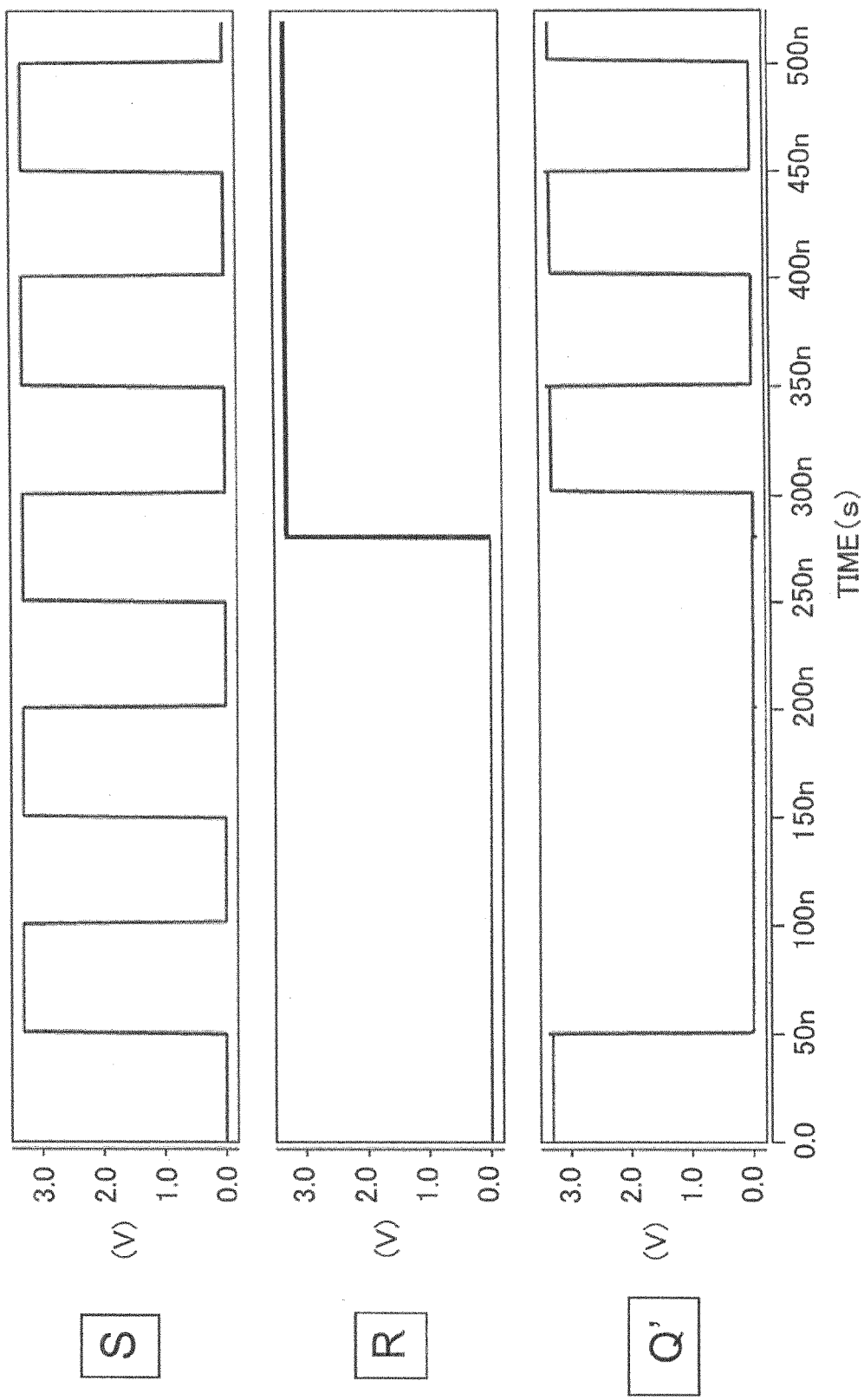
FIG. 8 is a timing chart of input signals S and R and an output signal Q' in the feedback circuit.

FIG. 8 is a timing chart of the input signals S and R and output signal Q' of the feedback circuit 51 of FIG. 7. Referring to FIG. 8, the longitudinal axis is labeled with voltages and the transversal axis is labeled with time.

When the input signal R is set to 0V, the output voltage Q' remains 0V even when the voltage level of the input signal S changes to 0V or 3.3V.

On the other hand, when the input signal R is set to 3.3V, the output voltage Q' will change to 3.3V when the input signal S is set to 0V and the output voltage Q' will change to 0V when the input signal S is set to 3.3V.

Therefore, the feedback circuit 51 receives the input signal R set to 3.3V until the output signal Q' set to 0V is outputted, and receives the input signal R set to 0V once the output signal Q' set to 0V is outputted.

As a result, the feedback circuit 51 supplies a feedback signal $FB_1$ comprising VDD to the gate of the p-type MOS transistor 213 in the WLA 21 until the signal $M_1$ becomes "1." Once the signal $M_1$ becomes "1," a feedback signal $FB_1$ comprising Vref Gnd) is continuously supplied to the gate of the p-type MOS transistor 213 in the WLA 21.

The foregoing will be applied in the same manner in the feedback circuits (52~5R).

Figure 9:
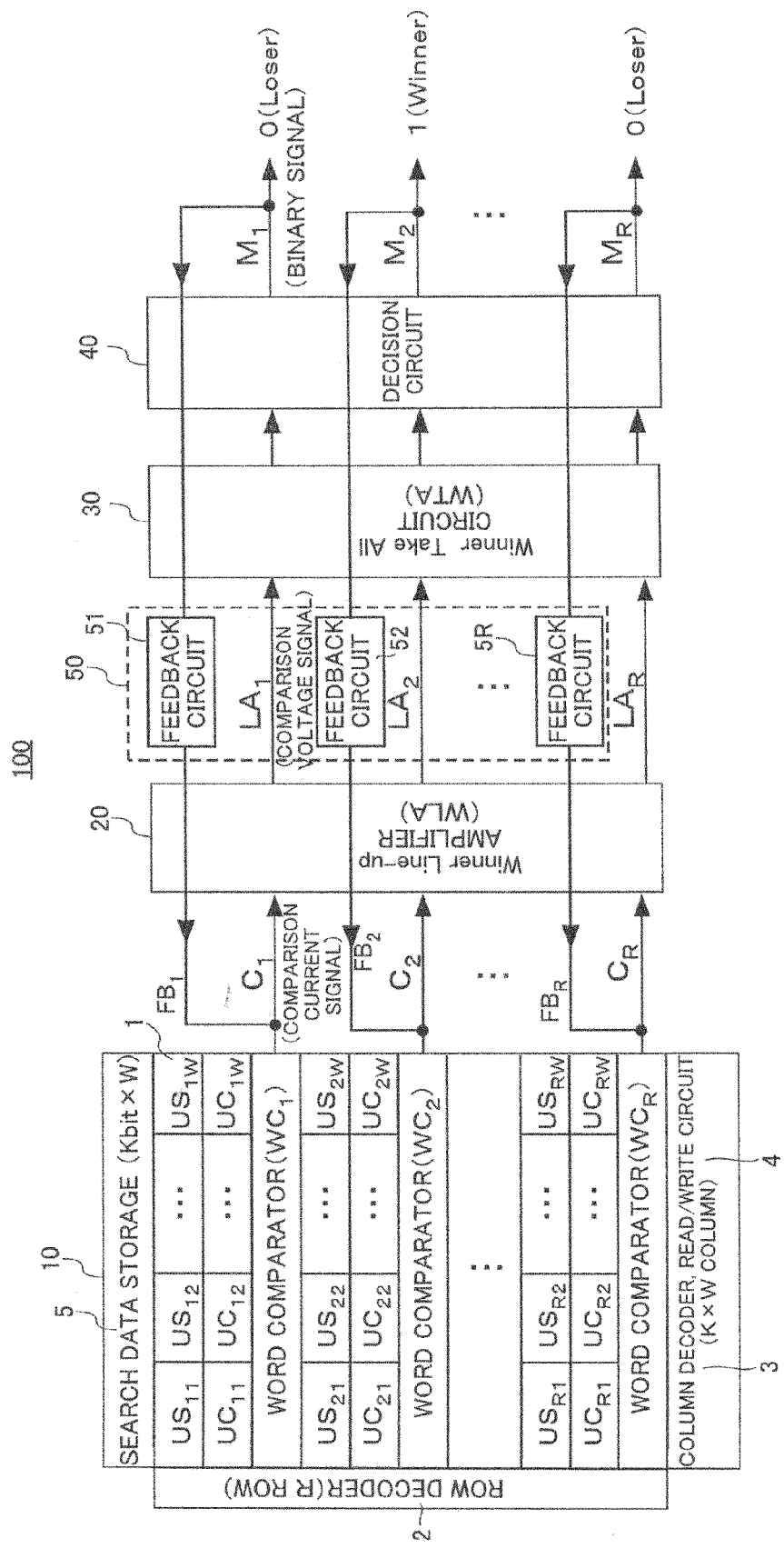
FIG. 9 is a first concept view illustrative of search operations in the associative memory of FIG. 1.
Figure 10:
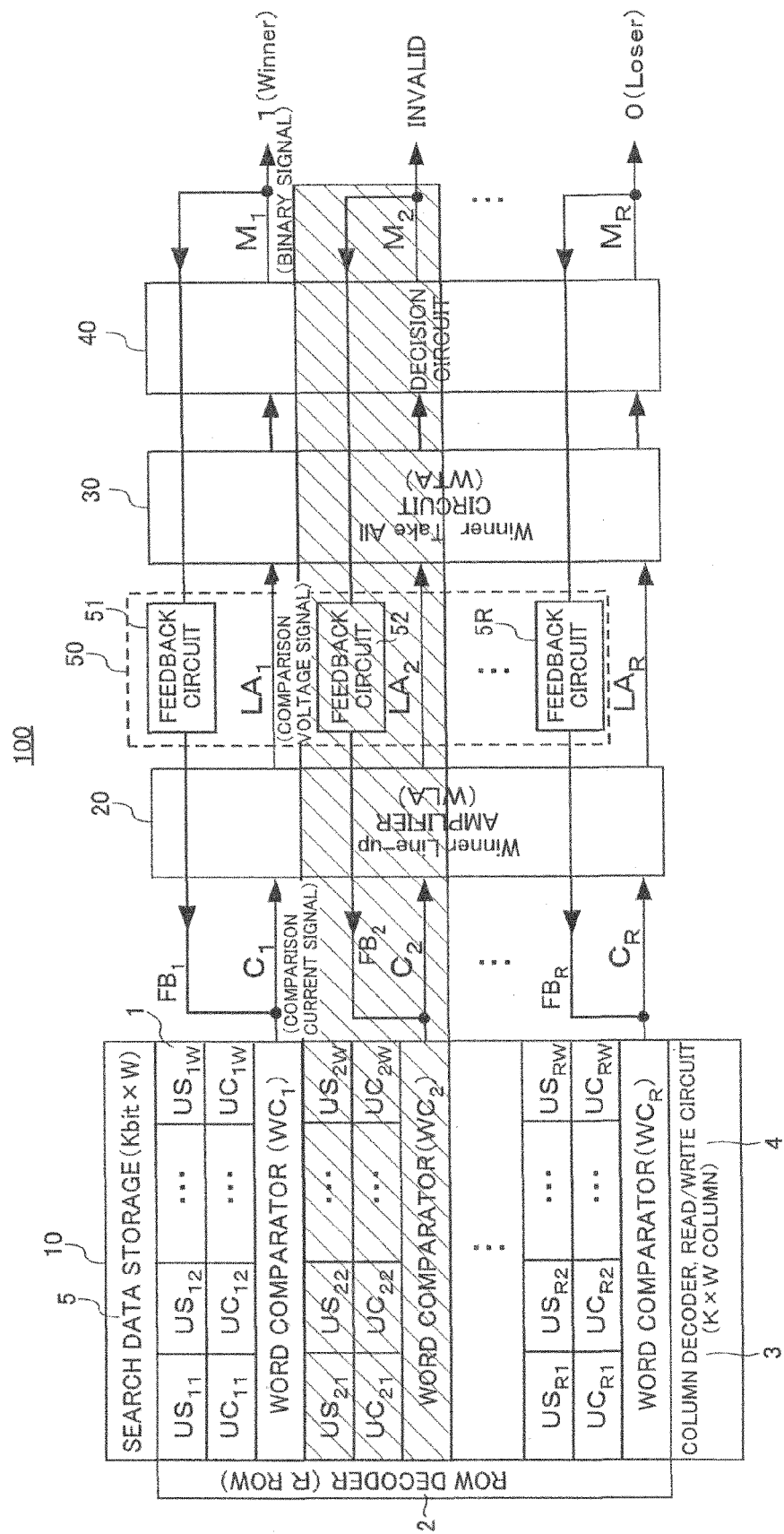
FIG. 10 is a second concept view illustrative of search operations in the associative memory of FIG. 1.

FIGS. 9 and 10 are first and second concept views for illustration of search operations in the associative memory 100 of FIG. 1. Referring to FIG. 9, if a search for reference data close to the search data is initiated, the memory array 10 compares the search data with each of plural reference data in parallel and generates plural comparison current signals $C_1 \sim C_R$ representing the results of the comparison.

Further, the WLA 20 receives the plural comparison current signals $C_1 \sim C_R$ from the memory array 10, and during the first cycle, receives feedback signals $FB_1 \sim FB_R$ each comprising a voltage VDD from the feedback circuit 50. As a result of the foregoing operations, the WLA 20 converts the plural comparison current signals $C_1 \sim C_R$ into plural voltages $V_{C1} \sim V_{CR}$, converts the lowest voltage $V_{C2}$ among the converted voltages $V_{C1} \sim V_{CR}$ into Winner $V_W$, converts the remaining voltages ($V_{C1} \sim V_{CR} \neq V_{C2}$) as Loser $V_L$, and outputs comparison voltage signals $LA_1 \sim LA_R$ to the WTA 30.

Also, the WTA 30 further amplifies the comparison voltage signals $LA_1 \sim LA_R$ received from the WLA 20 and outputs the amplified comparison voltage signals $LA_1 \sim LA_R$ to the decision circuit 40.

The decision circuit 40 converts the highest voltage $LA_2$ among the amplified comparison current signals $LA_1 \sim LA_R$ received from the WTA 30 into "1" Winner, and converts the remaining comparison current signals ($LA_1 \sim LA_R \neq LA_2$) into "0" Loser to output $M_1$, $M_3 \sim M_R=0$ and M2=1 as output signals.

Thereafter, during the second cycle in the associative memory 100, the feedback circuits (51~5R) receive signals $M_1 \sim M_R$, respectively. Further, the feedback circuits 51, (53~5R) generate feedback signals $FB_1$ and $FB_3 \sim FB_R$ comprising a voltage VDD in accordance with $M_1$ and $M_3 \sim M_R=0$, respectively, and output the generated feedback signals to the WLA 20. The feedback circuit 52 generates a feedback signal $FB_2$ comprising a voltage (Vref Gnd) in accordance with a signal $M_2=1$ and outputs the generated feedback signal to the WLA 20.

By doing so, the WLA 20 receives feedback signals $FB_1$, $FB_3 \sim FB_R$=VDD and a feedback signal ($FB_2$=Vref Gnd), and based on the received feedback signals $FB_1$, $FB_3 \sim FB_R$=VDD, and ($FB_2$=Vref Gnd) and according to the above-described operations, the WLA 20 detects the lowest voltage $V_{C1}$ among the $V_{C1}$ and $V_{C3} \sim V_{CR}$ as Winner $V_W$, detects the remaining voltages $V_{C3} \sim V_{CR}$ as Loser $V_L$, and outputs the comparison voltage signals $LA_1$ and $LA_3 \sim LA_R$ to the WTA 30. The WTA 30 further amplifies the comparison voltage signals $LA_1$ and $LA_3 \sim LA_R$ received from the WLA 20 to output them to the decision circuit 40. The decision circuit 40 converts the comparison voltage signal $LA_1$ into signal $M_1$ comprising "1" and converts the comparison voltage signals $LA_3 \sim LA_R$ into signals $M_3 \sim M_R$ comprising "0" to output the converted signals as output signals.

In other words, during the second cycle, the unit storages $US_{21} \sim US_{2W}$, unit comparators $UC_{21} \sim UC_{2W}$, word comparator $WC_2$, WLA 22, WTA 32 and decision circuit 42 are masked, such that a search of the remaining portions for the reference data closest to the search data is performed FIG. 10. That is, the comparison voltage signal $C_2$ is invalid during the second cycle.

Thereafter, the associative memory 100 masks a series of word comparators, to which Winner was outputted, and repeatedly performs the operation to search the reference data closest to the search data among the remaining reference data, and terminates the searching operation once the reference data k-th closest to the search data is searched.

Figure 11:
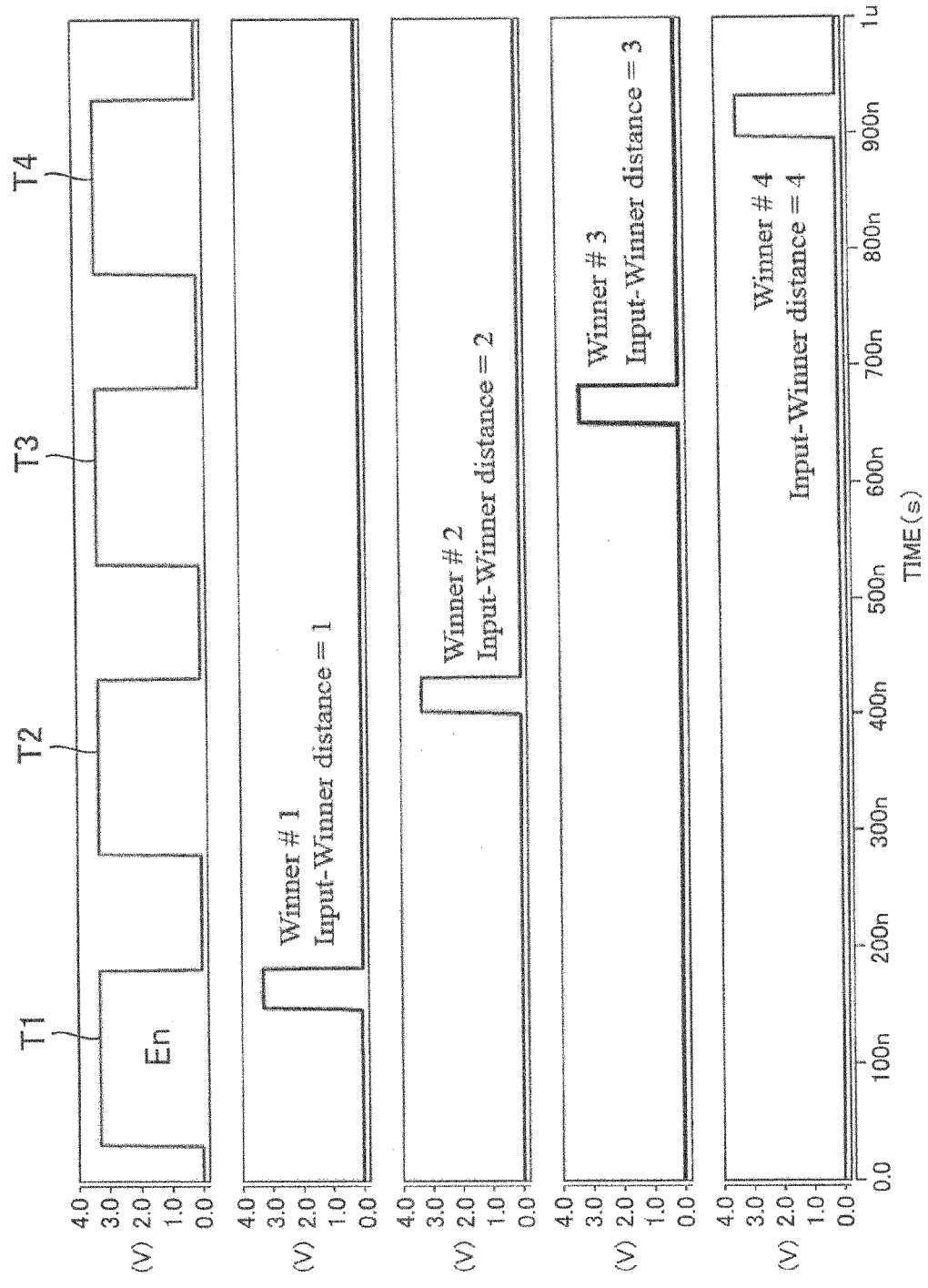
FIG. 11 illustrates the results of a simulation of search operations in a plurality of clocks in the associative memory of FIG. 1.

FIG. 11 shows the simulation illustrating the searching operation during plural clocks in the associative memory 100 of FIG. 1. Referring to FIG. 11, if the enable signal (En) is set to 3.3V during the first cycle T1, the associative memory 100 is enabled and outputs Winner #1 (Input-Winner distance=1) having the distance closest to the search data distance 1 in the first cycle T1.

Thereafter, the associative memory 100 is enabled during the second cycle T2 and outputs Winner #2 (Input-Winner distance=2) having the distance second closest the search data distance 2.

Similarly, the associative memory 100 outputs Winner #3 (Input-Winner distance=3) and Winner #4 (Input-Winner distance=4) having the respective distances third and fourth closest to the search data distance 3 and distance 4 during the third and fourth cycles T3 and T4.

After being outputted, Winners #1~#4 are disabled in the associative memory 100. Therefore, when outputting Winner #2 after Winner #1 is outputted, the reference data closest to the search data is searched from the reference data, which excludes Winner #1, and the searched reference data is outputted as Winner #2. This is applied in the same manner with respect to Winner #3 and Winner #4.

As a result, it is identified from the simulation shown in FIG. 11 that the associative memory 100 is able to search k number of reference data in the order in which earlier searched reference data is closer to the search data than later searched reference data.

Figure 12:
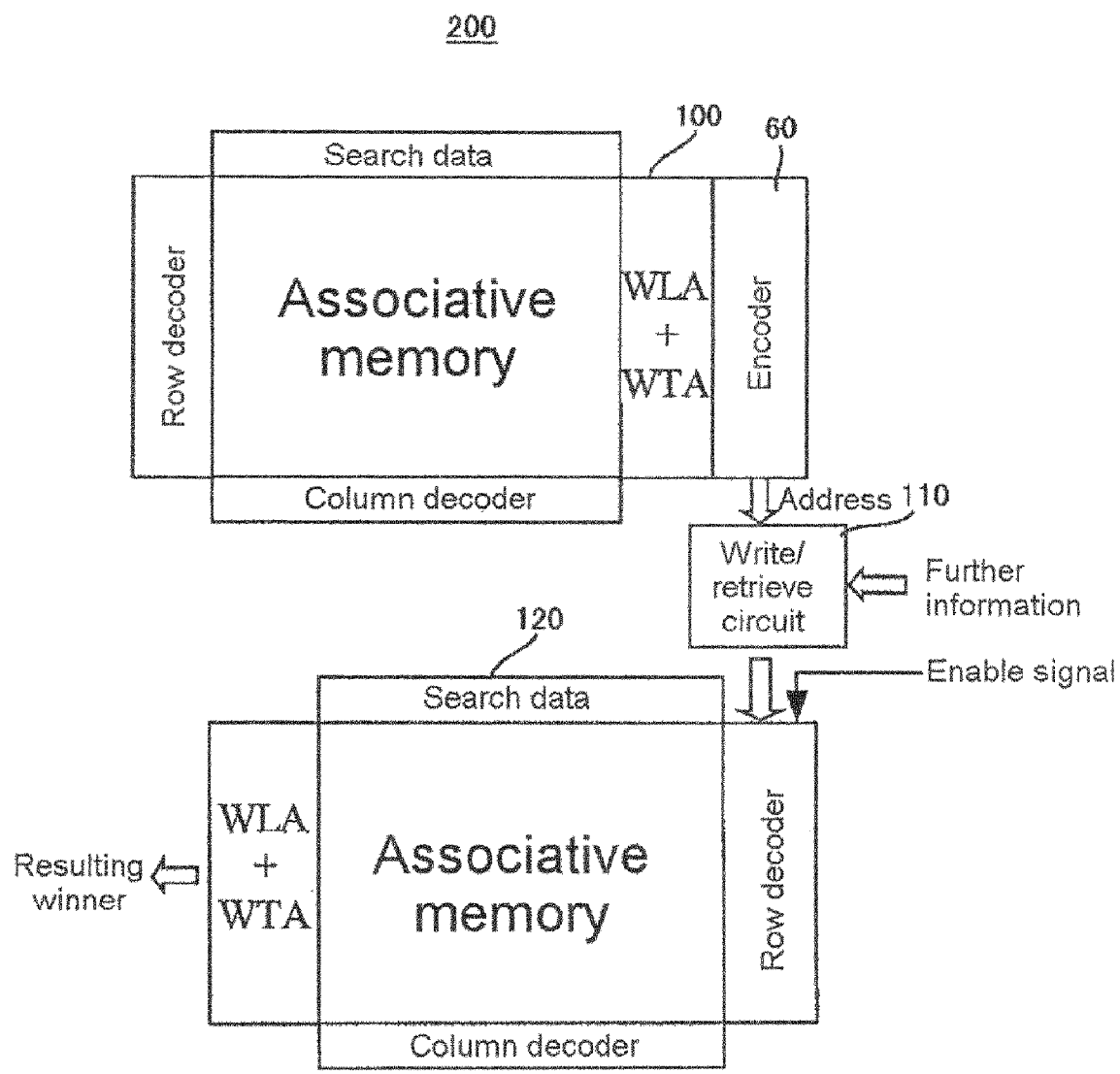
FIG. 12 is a configuration of a searching system according to an embodiment of the present disclosure.

FIG. 12 is a configuration of a searching system in an embodiment of the present disclosure. Referring to FIG. 12, the searching system 200 according to an embodiment of the present disclosure comprises an associative memory 100, Write/retrieve circuit 110, and associative memory 120. That is, the searching system 200 comprises the associative memory 100 shown in FIG. 1.

The associative memory 100 is the same as described hereinabove. Further, the associative memory 100 in the searching system 200 comprises an encoder 60. The encoder 60 receives k number of reference data searched by use of k number of clocks from the decision circuit 40, and generates addresses Add1~Addk for the k of received reference data. Then, the encoder 60 outputs the generated addresses Add1~Addk to the Write/Search Write/retrieve circuit 110.

The Write/retrieve circuit 110 receives addresses Add1~Addk from the associative memory 100, and receives further information such as data from the outside. Additionally, the Write/retrieve circuit 110 outputs addresses Add1~Addk and the further data to the associative memory 120.

The associative memory 120 compares the search data with each of k of reference data in parallel within k of reference data searched by the associative memory 100, searches the reference data closest to the search data and outputs the searched reference data as resulting Winner. The associative memory 120 comprises the same memory array as the memory array 10 of the associative memory 100. The associative memory 120 can receive an enable signal. Therefore, upon receiving addresses Add1~Addk for k number of reference data searched by the associative memory 100 from the encoder 60, the associative memory 120 may designate k number of reference data in its memory array by use of the addresses Add1~Addk, and may search the reference data matching the search data within k number of designated reference data.

In the searching system 200, the associative memory 100 searches k number of reference data close to the search data by use of the Hamming distance, and the associative memory 120 searches the reference data matching the search data among k of reference data by use of the Euclid distance.

Figure 13:
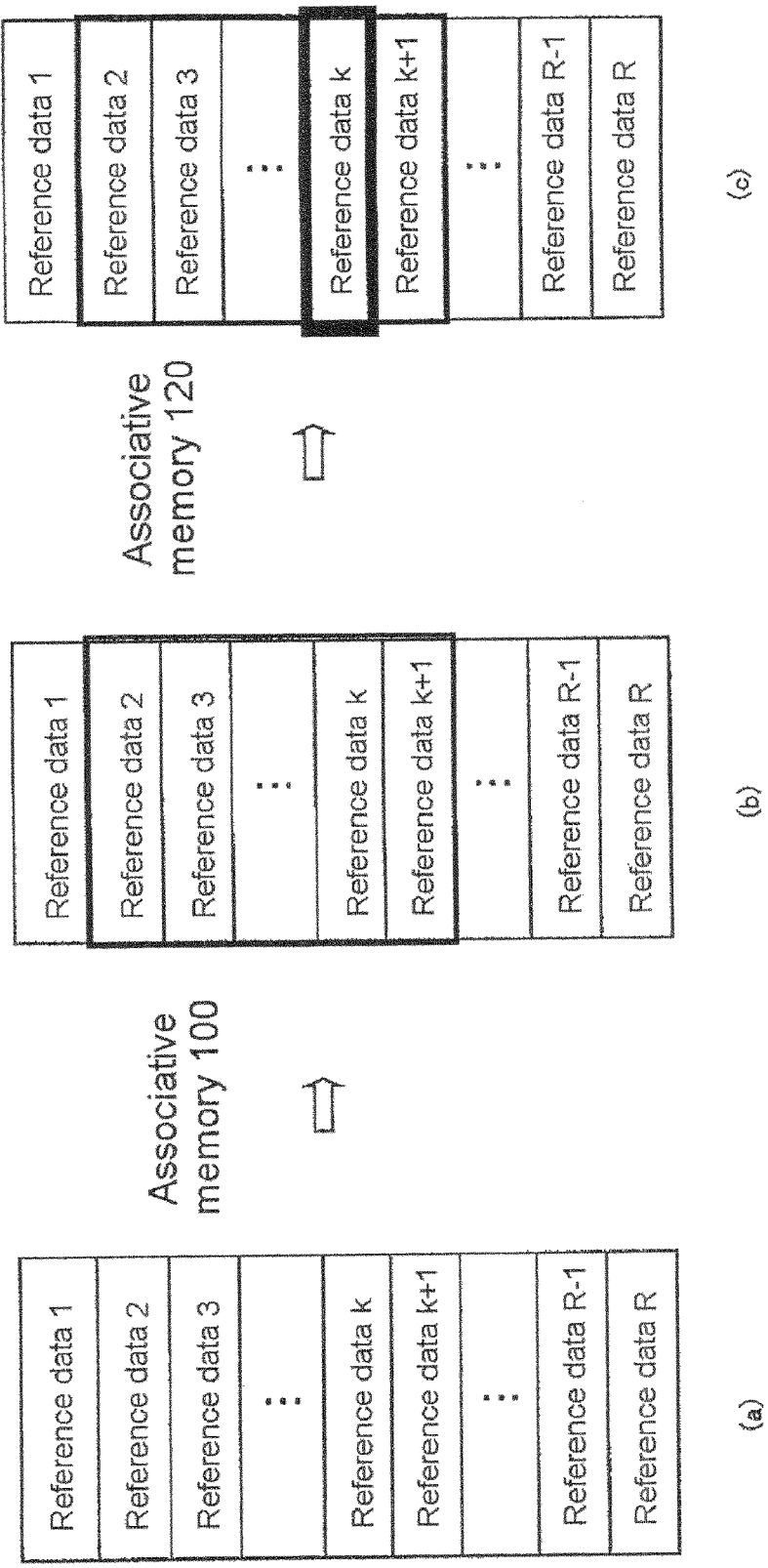
FIG. 13 is an image view of a search performed in the searching system of FIG. 12.

FIG. 13 is an image view of a search process performed in the searching system 200 shown in FIG. 12. The associative memories 100, 120 store R number of reference data (Reference data 1, Reference data 2, Reference data 3, . . . Reference data k, Reference data k+1, . . . Reference data R-1, Reference data R) in the memory array 10. As a result of the above-described operation, the associative memory 100 searches k number of reference data 2~k+1 close to the search data from, for example, the reference data R as shown in columns (a) and (b).

The associative memory 100 outputs addresses Add2~Addk+1 for the k number of searched reference data 2~k+1 to a row decoder of the associative memory 120 through the Write/Search circuit 110.

The row decoder of the associative memory 120 designates k number of reference data 2~k+1 in the memory array 10 based on the addresses Add2~Addk+1. Then, the associative memory 120 compares the search data stored in the search data storages with each of the k reference data 2~k+1 in parallel, and searches k number of reference data matching the search data as shown in columns (b) and (c).

As described above, the present disclosure carries out a search process narrowing the range of reference data by use of two associative memories 100, 120 and finally outputs the reference data matching the search data as Winner.

Accordingly, it is possible to correctly search the reference data matching the search data.

An example wherein the searching system 200 shown in FIG. 12 is applied will be explained. FIG. 14 shows strings of characters in different fonts. Referring to FIG. 14, there are four strings of characters LC1~LC4 each representing alphabets from A to Z. The string of characters LC1 is searched as resulting Winner.

In such case, the associative memory 100 retains [ABC . . . XYZ] as search data, and the Write/Search circuit 110 receives further data characterizing the string of characters LC1 from the outside. The associative memory 100, according to the above-described method, searches four reference data strings of characters (LC1~LC4) close to the search data [ABC . . . XYZ], and outputs the addresses of the four searched reference data strings of characters (LC1~LC4) to the Write/Search circuit 110.

The Write/Search circuit 110 inputs the addresses of the four reference data strings of characters (LC1~LC4) and further data characterizing the string of characters LC1 into the associative memory 120.

By dong so, the associative memory 120 designates the four reference data strings of characters (LC1~LC4) in the memory array 10 based on their addresses, searches the string of characters LC1 among the four reference data strings of characters (LC1~LC4) by use of the further data characterizing the string of characters LC1, and outputs the string of characters LC1 as resulting Winner.

As described above, the searching system 200 makes it possible to search the desired string of characters among different character strings.

By inputting the angles of the strings of characters in horizontal alignment as further data, it is possible to search a string of characters inclined at a predetermined angle out of its horizontal alignment.

Table 1 shows the results of an experiment carried out by use of a two-staged associative memory to search reference data matching search data.

TABLE 1

| Writer | Test Set 1 (26 Samples) Misclassification | | Test Set 2 (26 Samples) Misclassification | |
|---|---|---|---|---|
| | Single associative memory | Two-staged associative memory | Single associative memory | Two-staged associative memory |
| A | 4 | 2 | 4 | 2 |
| B | 4 | 1 | 3 | 1 |

TABLE 1-continued

| Writer | Test Set 1 (26 Samples) Misclassification | | Test Set 2 (26 Samples) Misclassification | |
|---|---|---|---|---|
| | Single associative memory | Two-staged associative memory | Single associative memory | Two-staged associative memory |
| C | 3 | 1 | 3 | 1 |
| D | 2 | 1 | 4 | 2 |
| Total | 12.5% | → 4.8% | 13.5% | → 5.8% |

Two tests were performed with 26 samples. In Test Set 1, the rate of failure to search reference data matching the search data of "A," "B," "C" and "D" was shown to be 12.5% when the single associative memory was used and to be 4.8% when the two-staged associative memory was used. In Test Set 2, the rate of failure was shown to be 13.5% when the single associative memory was used and to be 5.8% when the two-staged associative memory was used.

Therefore, as a result of using the two-staged associative memory, it is possible to significantly reduce the rate of failure to search the reference data matching the search data. In other words, the use of the two-staged associative memory makes it possible to correctly search the reference data matching the search data.

Figure 15:
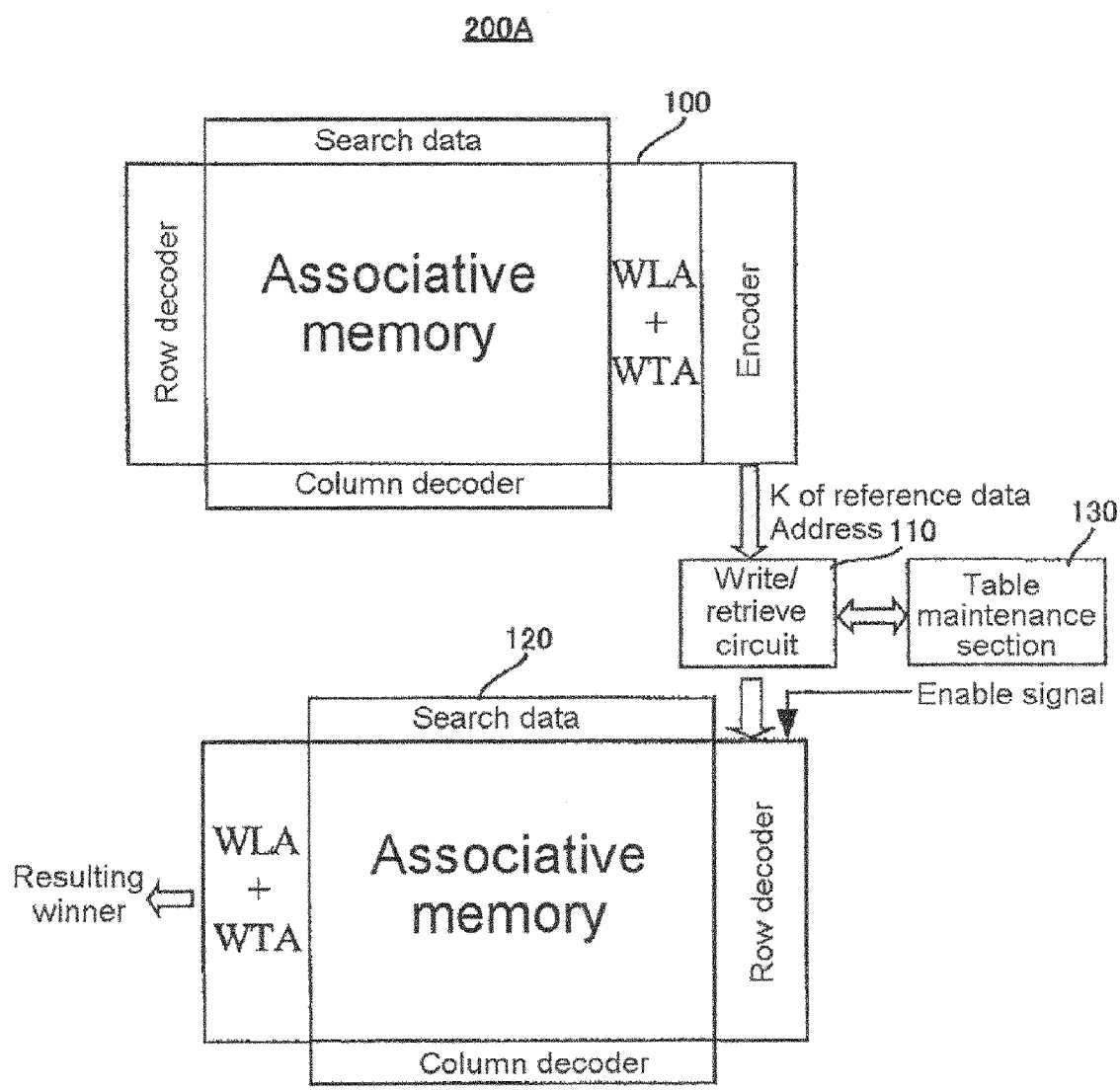
FIG. 15 is a configuration of a searching system in another embodiment of the present disclosure.

FIG. 15 shows a configuration of a searching system in another embodiment of the present disclosure. This searching system according to this embodiment may be the searching system 200A shown in FIG. 15. Referring to FIG. 15, the searching system 200A is the same as the searching system 200 shown in FIG. 12, except that the searching system 200A further comprises a table maintenance section 130.

The associative memory 100 in the searching system 200A outputs k number of reference data and addresses Add1~Addk to the Write/retrieve circuit 110.

The table maintenance section 130 retains a feature vector table CHT representing the corresponding relationship between the genres of k number of reference data and the feature vectors. Upon receiving k number of reference data from the Write/retrieve circuit 110, the table maintenance section 130 extracts the genres of the k number of reference data and extracts the feature vectors corresponding to the genres of the k number of reference data from the feature vector table CHT to output them to the Write/retrieve circuit 110.

FIG. 16 is a concept view of the feature vector table. Referring to FIG. 16, the feature vector table CHT comprises the genres of k number of reference data and feature vectors, wherein the genres of the k number of reference data and the feature vectors correspond to one another. The genres of the k number of reference data, for instance, include characters and images. A feature vector corresponding to a character, for instance, is a Gothic letter and a feature vector corresponding to an image is an oil painting.

Once a search is initiated by the searching system 200A, the associative memory 100 searches k number of reference data close to the search data according the above-described method, and outputs the k number of searched reference data and the addresses Add1~Addk for the k number of reference data to the Write/retrieve circuit 110.

The Write/retrieve circuit 110 outputs k number of reference data to the table maintenance section 130 upon receiving the k number of reference data and their addresses Add1~Addk from the associative memory 100. The table maintenance section 130 extracts the genres of the k reference data received from the Write/retrieve circuit 110 and extracts the feature vectors corresponding to the genres of the k number of reference data with reference to the feature vector table CHT to output the extracted feature vectors to the Write/retrieve circuit 110.

Upon receiving the feature vectors from the table maintenance section 130, the Write/retrieve circuit 110 writes the addresses Add1~Addk in the row decoder of the associative memory 120 and inputs the feature vectors into the associative memory 120 at the same time. The associative memory 120 can receive an enable signal. Further, the associative memory 120 designates k number of reference data in the memory array 10 based on the addresses Add1~Addk and searches the reference data matching the search data among the k reference data by use of the feature vectors. The associative memory 120 outputs the searched reference data as resulting Winner.

As a result, the searching system 200A is able to correctly search the reference data matching the search data.

Figure 17:
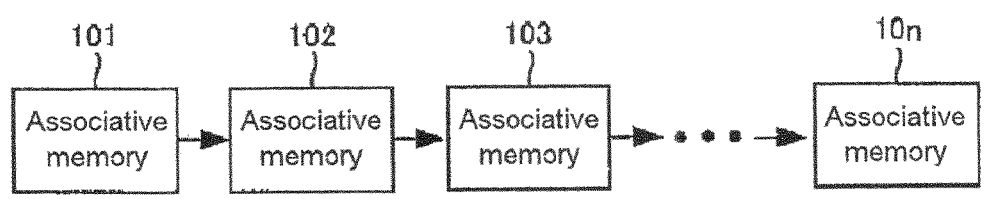
FIG. 17 is a configuration of a searching system in another embodiment of the present disclosure.

FIG. 17 is a configuration of a searching system in another embodiment of the present disclosure. Referring to FIG. 17, the searching system 200B comprises associative memories (101~10n) n is an integer equal to or greater than 3. The n of associative memories (101~10n) are connected in series. Therefore, the searching system 200B comprises an n-staged associative memory.

The respective associative memories (101~10n−1) comprise the above-described associative memory 100, and the associative memory 10n comprises the above-mentioned associative memory 120. Further, the associative memory 101 compares the search data with each of plural reference data in parallel, and outputs k1 number of reference data k1 is an integer equal to or greater than 2 to the associative memory 102 on the next stage in the order in which earlier outputted reference data is closer to later outputted reference data. The associative memory 102 searches the reference data close to the search data among the k1 number of reference data received from the associative memory 101, and outputs k2 number of reference data k2 is an integer satisfying (k2<k1) to the associative memory 103 on the next stage. In the same manner, the associative memories (103~10n−1) search the reference data close to the search data among k2, . . . and kn−2 of reference data received from the respective associative memories (102~10n−2) k2, . . . , and kn−2 are integers satisfying (k2> . . . >kn−2), and output k3, k4, . . . , and kn−1 of reference data to the next staged associative memories (104~10n) k3, k4, . . . , and kn−1 are integers satisfying (k3> . . . >kn−1). The associative memory 10n searches the reference data close to the search data among kn−1 of reference data received from the associative memory 10n−1, and outputs the reference data closest to the search data. In such case, the associative memories 102~10n search the reference data closest to the search data by use of respective distance indexes and/or feature vectors different from one another.

Figure 18:
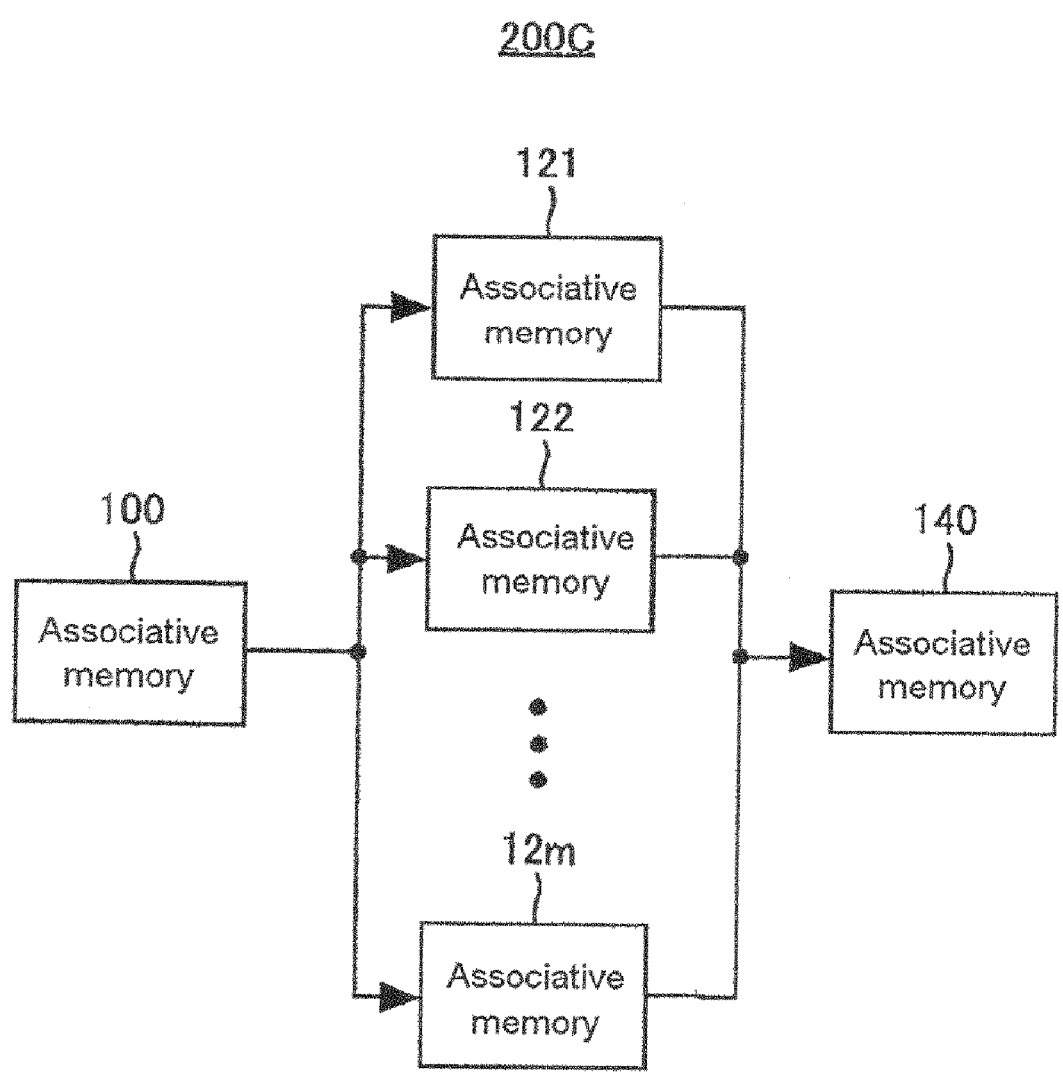
FIG. 18 is a configuration of a searching system in another embodiment of the present disclosure.
Figure 1:
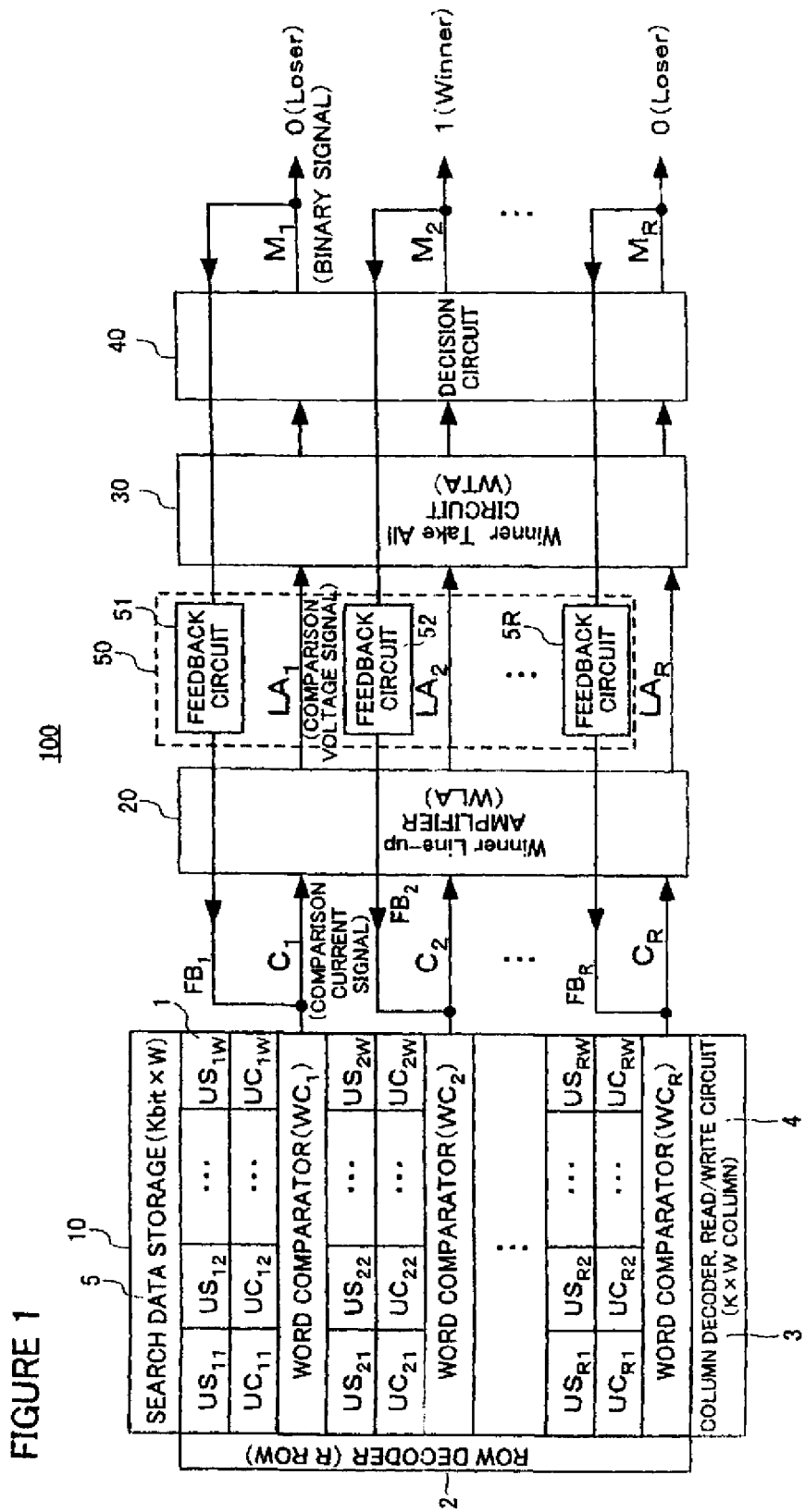

FIG. 18 is a configuration of a searching system in another embodiment of the present disclosure. Referring to FIG. 18, the searching system 200C comprises associative memories [100, 121~12m m is an integer equal to or greater than 2, 140].

The m number of associative memories (121~12m) are connected in parallel between the associative memory 100 and the associative memory 140. The respective associative memories 121~12m, 140 comprise the above-described associative memory 120.

The respective associative memories (121~12m) receive k number of reference data from the associative memory 100 and search the reference data closest to the search data among the k received reference data to output the searched data to the associative memory 140. Further, the associative memories (121~12m) search the reference data closest to the search data by use of respective distance indexes and/or respective feature vectors different from one another.

The associative memory 140 receives n number of reference data n is an integer satisfying (n≧m) from m number of associative memories (121~12m), and searches the reference data closest to the search data among n of received reference data.

In the searching system 200C, the associative memory 100 is the associative memory on the first stage, the m number of associative memories (121~12m) are the associative memory on the second stage, and the associative memory 140 is the associated memory on the third stage.

The searching system 200C selects plural candidates for reference data close to the search data through the associative memories (121~12m) by use of plural distance indexes plural feature vectors), and determines the reference data closest to the search data by the associative memory 140 on the last stage.

Therefore, the searching system 200C makes it possible to correctly search the reference data closest to the search data.

The searching system according to the present disclosure may replace at least one of the associative memories (102~10n−1) with m number of associative memories (121~12m) shown in FIG. 18. Further, when two or more associative memories among the associative memories (102~10n−1) are replaced with the m associative memories (121~12m) respectively, the number of two or more associative memories may be the same or different from the m number of associative memories (121~12m). Also, when two or more associative memories selected among the associative memories (102~10n−1) are respectively replaced with the m number of associative memories (121~12m), the respective two or more consecutive associative memories may be replaced with the m number of associative memories (121~12m), or two or more associative memories spaced from one another with a gap of one or more other associative memories therebetween may be replaced with the m of associative memories (121~12m).

The searching system according to the present disclosure may be the searching system 200C of FIG. 18 from which the associative memory 100 is deleted.

In the above, it is described that the associative memory 100 searches k number of reference data close to the search data based on a Hamming distance, and that the associative memory 120 searches the reference data matching the search data based on a Euclid distance. The present disclosure, however, is not limited by the above descriptions. Rather, the associative memory 100 may search k number of reference data close to the search data based on a Euclid distance, and the associative memory 120 may search the reference data matching the search data based on a Hamming distance. Also, the associative memories 100, 120 may search the reference data matching the search data by use of a combination of the Hamming distance and the Euclid distance or another distance index.

Although it is described above that the respective feedback circuits (51~5R) comprise an SR flip-flop, the present disclosure is not limited thereto. Rather, the feedback circuits (51~5R) may comprise a register having a resetting and setting function.

In the present disclosure, the WLA 20, WTA circuit 30 and feedback circuit 50 constitute an output circuit.

Further, according to the present disclosure, the WLA 20 is configured as a first amplifier and the WTA 30 is configured as a second amplifier.

Also, according to the present disclosure, the associative memory 100 is configured as a first associative memory and the associative memory 120 is configured as a second associative memory.

Additionally, according to the present disclosure, the associative memory 101 is configured as a first associative memory and the associative memories (102~10n) is configured as a second associative memory.

According to the present disclosure, the associative memory 100 in the searching system 200C is configured as a first associative memory and the associative memories (121~12m), 140 are configured as a second associative memory.

The modes of the embodiments provided in the present disclosure are of illustrative in every aspect, and not for restriction. The scope of the present disclosure is defined by the claims, and not by the foregoing descriptions of embodiments, and is intended to cover all modifications within the meaning and scope of equivalents to the claims.

The present disclosure applies to an associative memory capable of outputting plural reference data close to the search data. Further, the present disclosure applies to a searching system comprising an associative memory capable of outputting plural reference data close to the search data.

The present disclosure may be embodied in other specific forms without departing from its basic features or characteristics. Thus, the described embodiments are to be considered in all respects only as illustrative, and not restrictive. The scope of the disclosure is, therefore, indicated by the appended claims, rather than by the foregoing description. All changes within the meaning and range of equivalency of the claims are to be embraced within their scope.

The invention claimed is:

1. An associative memory comprising:
a memory array configured to compare each of stored multiple reference data with input search data in parallel and to generate multiple comparison current signals representing a result of the comparison; and
an output circuit that at a j-th search of reference data close to the input search data, wherein j is an integer satisfying $1 < j \leqq k$ wherein k is an integer equal to or greater than 2, the output circuit being configured to exclude j−1 number of reference data searched until the search performed j−1 times from the multiple reference data and to convert the multiple comparison current signals into voltages to detect the reference data closest to the search data from the remaining reference data, while amplifying the converted voltages to execute k times a signal generation operation for generating a j-th output signal.

2. The associative memory of claim 1, wherein the output circuit comprises:
a first amplifier, during a j-th signal generation operation, configured to convert the multiple comparison current signals generated by the memory array to multiple voltages, to detect remaining voltages other than a voltage representing the reference data j−1-th closest to the search data from the multiple voltages based on a j−1-th feedback signal, and to amplify the detected remaining voltages into a first voltage representing the reference data j-th closest to the search data and a second voltage representing the reference data remote from the search data;
a second amplifier, during the j-th signal generation operation, configured to further amplify the first and second voltages outputted from the first amplifier to generate the j-th output signal; and
a feedback circuit, during the j-th signal generation operation, configured to generate a j−1-th feedback signal based on a j−1-th output signal outputted from the second amplifier and outputting the j−1-th feedback signal to the first amplifier.

3. The associative memory of claim 2, wherein the first amplifier is configured to invalidate the comparison current signal representing the reference data j−1-th closest to the search data based on the j−1-th feedback signal to detect remaining voltages other than a voltage representing the reference data j−1-th closest to the search data from the multiple voltages.

4. The associative memory of claim 2, wherein if the remaining voltages other than a voltage representing the reference data j−1-th closest to the search data from the multiple voltages are detected, the first amplifier is configured to set a threshold value for dividing the remaining voltages into first and second voltages, and to compare the respective remaining voltages with the threshold value to amplify the remaining voltages into the first and second voltages.

* * * * *

UNITED STATES PATENT AND TRADEMARK OFFICE
CERTIFICATE OF CORRECTION

PATENT NO. : 7,957,171 B2
APPLICATION NO. : 12/128126
DATED : June 7, 2011
INVENTOR(S) : Abedin et al.

It is certified that error appears in the above-identified patent and that said Letters Patent is hereby corrected as shown below:

Delete the Title Page and substitute the attached Title Page therefor.

On the Title Page, in Field (52), under "U.S. Cl.", in Column 1, Line 2, delete "365/49; 365/13;" and insert -- 365/49.13; --, therefor.

In the drawings, delete figure 1, and substitute the attached figure 1, therefor.

In Column 4, Line 61, delete "$US_{11} \sim US_{1W}$" and insert -- $US_{11} \sim US_{1W}$, --, therefor.

In Column 5, Line 31, in Equation 1, delete " $=\sum |D_1 - S_1|$ " and insert -- $=\sum |D_i - S_i|$ --, therefor.

In Column 5, Line 34, delete "Di and Si" and insert -- $D_i$ and $S_i$ --, therefor.

In Column 5, Line 41, in Equation 2, delete " $D_{Eucl} = \sqrt{\sum |D_1 - S_1|^2}$ " and insert -- $D_{Eucl} = \sqrt{\sum |D_i - S_i|^2}$ --, therefor.

In Column 6, Line 26, delete "FBi" and insert -- $FB_i$ --, therefor.

In Column 10, Line 40, delete "See" and insert -- (See --, therefor.

In Column 12, Line 60, delete "Vref" and insert -- (Vref --, therefor.

In Column 14, Line 36, after "the" delete "Write/Search".

Signed and Sealed this
Nineteenth Day of June, 2012

David J. Kappos
*Director of the United States Patent and Trademark Office*

In Column 17, Line 57, delete "12m m" and insert -- 12m, m --, therefor.

In Column 18, Line 18, delete "vectors)," and insert -- vectors, --, therefor.

(12) United States Patent
Abedin et al.

(10) Patent No.: US 7,957,171 B2
(45) Date of Patent: Jun. 7, 2011

(54) ASSOCIATIVE MEMORY AND SEARCHING SYSTEM USING THE SAME

(75) Inventors: Md. Anwarul Abedin, Hiroshima (JP); Tetsushi Koide, Hiroshima (JP); Hans Juergen Mattausch, Hiroshima (JP); Yuki Tanaka, Hiroshima (JP)

(73) Assignee: Hiroshima University, Hiroshima (JP)

( * ) Notice: Subject to any disclaimer, the term of this patent is extended or adjusted under 35 U.S.C. 154(b) by 328 days.

(21) Appl. No.: 12/128,126

(22) Filed: May 28, 2008

(65) Prior Publication Data
US 2009/0141531 A1 Jun. 4, 2009

(30) Foreign Application Priority Data
Nov. 30, 2007 (JP) ................................ 2007-309856

(51) Int. Cl.
*G11C 15/00* (2006.01)
(52) U.S. Cl. ............... 365/49.1; 365/49.11; 365/49.12; 365/49; 365/13; 365/49.15; 365/49.16; 365/49.17; 365/49.18
(58) Field of Classification Search ............... 365/49.1, 365/49.11, 49.12, 49.13, 49.15, 49.16, 49.17, 365/49.18
See application file for complete search history.

(56) References Cited

U.S. PATENT DOCUMENTS

| | | | |
|---|---|---|---|
| 6,076,141 A * | 6/2000 | Tremblay et al. | 365/49.17 |
| 6,212,106 B1 * | 4/2001 | Kurotsu | 365/49.17 |
| 6,415,293 B1 * | 7/2002 | Navoni et al. | 365/49.16 |
| 6,693,815 B2 * | 2/2004 | Mattausch et al. | 365/49.17 |
| 6,714,466 B2 * | 3/2004 | Park et al. | 365/49.17 |
| 6,721,193 B2 * | 4/2004 | Barnes | 365/49.17 |
| 6,775,167 B1 * | 8/2004 | Avramescu et al. | 365/49.11 |
| 6,856,528 B1 * | 2/2005 | Kim | 365/49.1 |
| 6,876,560 B2 * | 4/2005 | Sugahara et al. | 365/49.1 |
| 6,976,126 B2 * | 12/2005 | Clegg et al. | 365/49.1 |
| 7,113,416 B2 * | 9/2006 | Koide et al. | 365/49.1 |
| 7,203,382 B2 * | 4/2007 | Mattausch et al. | 365/49.1 |
| 7,746,678 B2 * | 6/2010 | Mattausch et al. | 365/49.1 |

FOREIGN PATENT DOCUMENTS

| | | |
|---|---|---|
| JP | 2000-298095 | 10/2000 |
| JP | 2002-288985 | 10/2002 |
| JP | 2004-005825 | 1.2004 |
| JP | 2005-209317 | 8/2005 |

OTHER PUBLICATIONS

D.R. Tveter, "The Pattern Recognition Basis of Artificial Intelligence," IEEE computer society, 1998, pp. 84-92.
H.J. Mattausch, T. Gyohten, Y. Soda and T. Koide, "Compact Associative-Memory Architecture with Fully-Parallel Search Capability for the Minimum Hamming Distance", IEEE Journal of Solid-State circuits, vol. 37, No. 2, Feb. 2002, pp. 218-227.
H.J. Mattausch, N. Omori, S. Fukae, T. Koide and T. Gyohten, "Fully-Parallel Pattern-Matching Engine with Dynamic Adaptability to Hamming or Manhattan Distance", 2002 Symposium on VLSI Circuit Digest of Technical Papers, 2002, pp. 252-255.

* cited by examiner

*Primary Examiner* — Trong Phan
(74) *Attorney, Agent, or Firm* — Foley & Lardner LLP

(57) ABSTRACT

Associative memories capable of outputting multiple reference data close to search data are provided. A memory array compares each of the multiple reference data with the search data in parallel and generates multiple comparison current signals representing the result of the comparison. A WLA converts the multiple comparison current signals into voltages. During the first cycle, the WLA detects the lowest voltage among the voltages as Winner and detects the remaining voltages as Loser. After the second cycle, based on feedback signals, the WLA detects all the voltages other than a voltage detected as Winner during the last preceding cycle, and detects the lowest voltage among the detected voltages as Winner and detects the remaining detected voltages as Loser. The WLA repeats these operations k times.

4 Claims, 17 Drawing Sheets